(12) United States Patent
Park

(10) Patent No.: US 11,545,849 B2
(45) Date of Patent: Jan. 3, 2023

(54) ELECTRONIC DEVICE FOR CONTROLLING WIRELESS CHARGING ACCORDING TO STATE OF EXTERNAL DEVICE MOUNTED TO ELECTRONIC DEVICE, AND OPERATION METHOD THEREOF

(71) Applicant: Samsung Electronics Co., Ltd., Gyeonggi-do (KR)

(72) Inventor: Joon-Yung Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 343 days.

(21) Appl. No.: 16/650,090

(22) PCT Filed: Sep. 11, 2018

(86) PCT No.: PCT/KR2018/010616
§ 371 (c)(1),
(2) Date: Mar. 24, 2020

(87) PCT Pub. No.: WO2019/066307
PCT Pub. Date: Apr. 4, 2019

(65) Prior Publication Data
US 2020/0235603 A1    Jul. 23, 2020

(30) Foreign Application Priority Data
Sep. 27, 2017 (KR) .................. 10-2017-0125108

(51) Int. Cl.
*G01R 33/07* (2006.01)
*H02J 7/12* (2006.01)
*H02J 50/10* (2016.01)

(52) U.S. Cl.
CPC ............ *H02J 7/12* (2013.01); *G01R 33/07* (2013.01); *H02J 50/10* (2016.02)

(58) Field of Classification Search
CPC ..... G01R 33/07; G01R 33/072; G06F 1/1677; G06F 1/188; G06F 1/26; G06F 2200/1633
See application file for complete search history.

(56) References Cited

U.S. PATENT DOCUMENTS

2011/0260681 A1* 10/2011 Guccione ............... H02J 50/40
320/108
2013/0328825 A1* 12/2013 Brown .................... G01B 7/30
345/174

(Continued)

FOREIGN PATENT DOCUMENTS

CN    106790859 A    5/2017
DE    102016200482 A1 * 7/2017
(Continued)

OTHER PUBLICATIONS

Notice of Preliminary Rejection dated Jun. 13, 2022.

*Primary Examiner* — Dominic E Hawkins
(74) *Attorney, Agent, or Firm* — Cha & Reiter, LLC

(57) ABSTRACT

An electronic device according to various embodiments may include: a hall integrated circuit (IC) configured to detect magnetic flux generated by an external device enclosing at least a portion of the electronic device; a wireless charging circuit; and at least one processor configured to be connected to the hall IC and the wireless charging circuit, wherein the at least one processor is configured to: receive an output value for the detected magnetic flux from the hall IC; and control the wireless charging circuit, based on the output value.

19 Claims, 15 Drawing Sheets

(56) References Cited

U.S. PATENT DOCUMENTS

| | | | |
|---|---|---|---|
| 2014/0055098 A1* | 2/2014 | Lee | H04B 5/0037 |
| | | | 320/137 |
| 2014/0205799 A1* | 7/2014 | Lin | G02B 27/022 |
| | | | 428/138 |
| 2015/0256021 A1 | 9/2015 | Kwon et al. | |
| 2015/0349578 A1* | 12/2015 | Hu | H02J 50/70 |
| | | | 320/108 |
| 2016/0077621 A1* | 3/2016 | Min | G06F 1/1677 |
| | | | 345/173 |
| 2016/0261133 A1* | 9/2016 | Wang | H02J 7/0044 |
| 2016/0373563 A1* | 12/2016 | Ive | H04M 1/72409 |
| 2017/0235338 A1* | 8/2017 | Wong | G06F 1/1652 |
| | | | 361/679.3 |
| 2018/0166894 A1* | 6/2018 | Miller | B41J 3/445 |
| 2020/0303940 A1* | 9/2020 | Harris | H02J 50/005 |

FOREIGN PATENT DOCUMENTS

| | | |
|---|---|---|
| EP | 2 966 413 A1 | 1/2016 |
| JP | 2017-54353 A | 3/2017 |
| JP | 6117442 B2 | 4/2017 |
| KR | 20-0470862 Y1 | 1/2014 |
| KR | 10-2015-0081394 A | 7/2015 |
| KR | 10-2015-0105064 A | 9/2015 |
| KR | 10-2015-0138730 A | 12/2015 |
| KR | 10-2016-0030732 A | 2/2016 |
| KR | 10-2016-0150363 A | 12/2016 |

* cited by examiner

| Pin No. | Symbol | Pin Description |
|---|---|---|
| 1 | VDD | Power supply pin |
| 2 | VSS | GND pin |
| 3 | Out 1 | Output pin 1 |
| 4 | Out 2 | Output pin 2 |

810

830

850

ELECTRONIC DEVICE FOR CONTROLLING WIRELESS CHARGING ACCORDING TO STATE OF EXTERNAL DEVICE MOUNTED TO ELECTRONIC DEVICE, AND OPERATION METHOD THEREOF

CLAIM OF PRIORITY

This application is a National Phase Entry of PCT International Application No. PCT/KR2018/010616, which was filed on Sep. 11, 2018, and claims a priority to Korean Patent Application No. 10-2017-0125108, which was filed on Sep. 27, 2017, the contents of which are incorporated herein by reference.

TECHNICAL FIELD

Various embodiments relate to a method and a device for controlling wireless charging of an electronic device depending on the state of an external device mounted on the electronic device.

BACKGROUND ART

The development of digital technology has promoted the spread of various electronic devices such as mobile communication terminals, personal digital assistants (PDAs), electronic organizers, smart phones, tablet personal computers (PCs), or wearable devices. Auxiliary devices to be used for various electronic devices are being developed, in connection with the spread of various electronic devices. The auxiliary devices may include a cover (or case) that may be mounted on an electronic device to protect the electronic device, a wireless charging device, and the like. For example, the lid of the cover (or case) may accommodate a card (e.g., a credit card, a debit card, or the like).

An electronic device may identify whether the lid of the cover is closed or open. For example, a hall sensor included in the electronic device may detect a magnetic field generated by a magnet included in the lid of the cover, and the electronic device may detect whether the lid is closed or open using the magnetic field.

Meanwhile, the electronic device may perform wireless charging while it is wirelessly connected to a wireless charging device (e.g., a wireless charging pad). For example, when the electronic device may be placed on a wireless charging device, a verification procedure may be performed through wireless communication, thereby receiving power wirelessly from the wireless charging device.

DISCLOSURE OF INVENTION

Technical Problem

Although the electronic device can determine whether the lid of the cover is closed or open, it may not determine whether or not the lid of the cover is folded backwards. If the electronic device performs wireless charging while the lid of the cover is folded backwards, a card accommodated in the lid may be damaged. For example, when the lid of the cover is folded backwards, an integrated circuit (IC) included in the card may be burned by a high voltage in the process of receiving power wirelessly from the wireless charging device.

Various embodiments can provide an electronic device and a method for identifying the state of an external device as one of a closed state, an open state, and a backward-folded state and for blocking wireless charging when the state of the external device is the backward-folded state.

Various embodiments can provide an electronic device and a method for identifying whether or not the state of the external device is the backward-folded state in response to recognition of wireless charging and for blocking wireless charging when the state of the external device is the backward-folded state.

The technical problems to be solved by the present disclosure are not limited to the above-mentioned technical problems, and other technical problems, which have not been mentioned above, may be clearly understood by those skilled in the art from the following description.

Solution to Problem

An electronic device according to various embodiments may include: a hall integrated circuit (IC) configured to detect magnetic flux generated by an external device enclosing at least a portion of the electronic device; a wireless charging circuit; and at least one processor configured to be connected to the hall IC and the wireless charging circuit, wherein the at least one processor may be configured to: receive an output value for the detected magnetic flux from the hall IC; and control the wireless charging circuit, based on the output value.

An operating method of an electronic device, according to various embodiments, may include: letting a hall integrated circuit (IC) of the electronic device detect magnetic flux generated by an external device enclosing at least a portion of the electronic device; letting at least one processor of the electronic device receive an output value for the detected magnetic flux from the hall IC; and letting the at least one processor control a wireless charging circuit of the electronic device, based on the output value.

Advantageous Effects of Invention

An electronic device and a method according to various embodiments can identify the state of an external device as one of a closed state, an open state, and a backward-folded state, and, when the state of the external device is the backward-folded state, can block wireless charging, thereby preventing a card accommodated in the lid of the external device from being damaged.

Effects which can be acquired by the present disclosure are not limited to the above described effects, and other effects that have not been mentioned may be clearly understood by those skilled in the art from the following description.

BEST MODE FOR CARRYING OUT THE INVENTION

Figure 1:
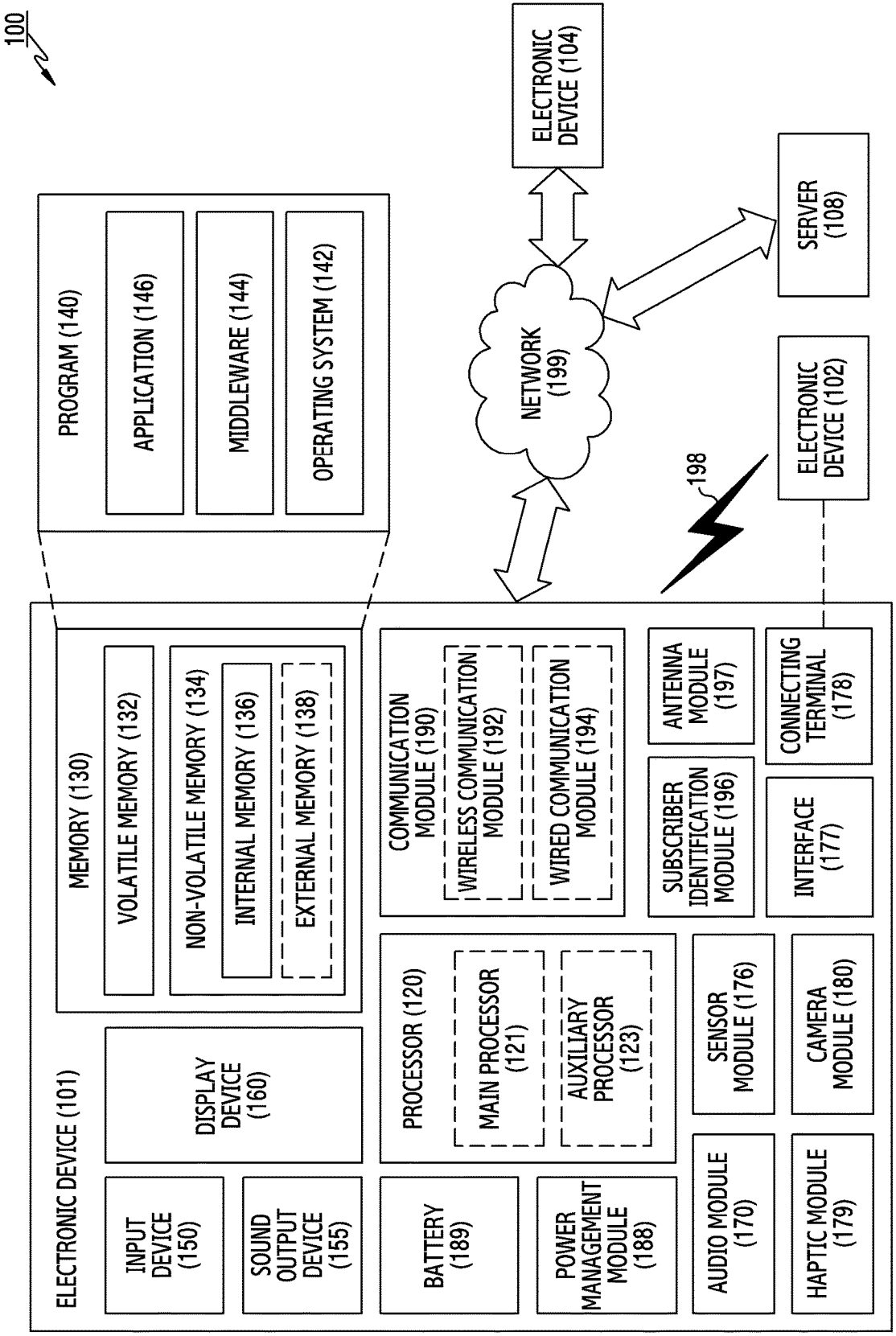
FIG. 1 is a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
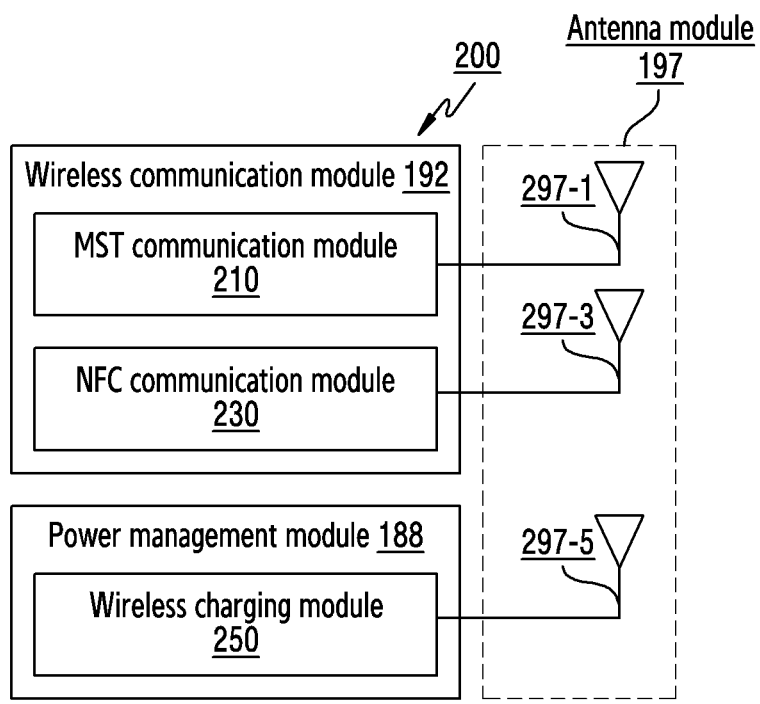
FIG. 2 is a block diagram of a wireless communication module, a power management module, and an antenna module of an electronic device according to various embodiments.

FIG. 2 is a block diagram 200 illustrating the wireless communication module 192, the power management module 188, and the antenna module 197 of the electronic device 101 according to various embodiments.

Referring to FIG. 2, the wireless communication module 192 may include a magnetic secure transmission (MST) communication module 210 or a near-field communication (NFC) module 230, and the power management module 188 may include a wireless charging module 250. In such a case, the antenna module 197 may include a plurality of antennas that include a MST antenna 297-1 connected with the MST communication module 210, a NFC antenna 297-3 connected with the NFC communication module 230, and a wireless charging antenna 297-5 connected with the wireless charging module 250. For ease of description, the same components as those described in regard to FIG. 1 are briefly described or omitted from the description.

The MST communication module 210 may receive a signal containing control information or payment information such as card information from the processor 120, generate a magnetic signal corresponding to the received signal, and then transfer the generated magnetic signal to the external electronic device 102 (e.g., a point-of-sale (POS) device) via the MST antenna 297-1. To generate the magnetic signal, according to an embodiment, the MST communication module 210 may include a switching module (not shown) that includes one or more switches connected with the MST antenna 297-1, and control the switching module to change the direction of voltage or current supplied to the MST antenna 297-1 according to the received signal. The change of the direction of the voltage or current allows the direction of the magnetic signal (e.g., a magnetic field) emitted from the MST antenna 297-1 to change accordingly. If detected at the external electronic device 102, the magnetic signal with its direction changing may cause an effect (e.g., a waveform) similar to that of a magnetic field that is generated when a magnetic card corresponding to the card information associated with the received signal is swiped through a card reader of the electronic device 102. According to an embodiment, for example, payment-related information and a control signal that are received by the electronic device 102 in the form of the magnetic signal may be further transmitted to an external server 108 (e.g., a payment server) via the network 199.

The NFC communication module 230 may obtain a signal containing control information or payment information such as card information from the processor 120 and transmit the obtained signal to the external electronic device 102 via the NFC antenna 297-3. According to an embodiment, the NFC communication module 230 may receive such a signal transmitted from the external electronic device 102 via the NFC antenna 297-3.

The wireless charging module 250 may wirelessly transmit power to the external electronic device 102 (e.g., a cellular phone or wearable device) via the wireless charging antenna 297-5, or wirelessly receive power from the external electronic device 102 (e.g., a wireless charging device). The wireless charging module 250 may support one or more of various wireless charging schemes including, for example, a magnetic resonance scheme or a magnetic induction scheme.

According to an embodiment, some of the MST antenna 297-1, the NFC antenna 297-3, or the wireless charging antenna 297-5 may share at least part of their radiators. For example, the radiator of the MST antenna 297-1 may be used as the radiator of the NFC antenna 297-3 or the wireless charging antenna 297-5, or vice versa. In such a case, the antenna module 197 may include a switching circuit (not shown) adapted to selectively connect (e.g., close) or disconnect (e.g. open) at least part of the antennas 297-1, 297-3, or 297-5, for example, under the control of the wireless communication module 192 (e.g., the MST communication module 210 or the NFC communication module 230) or the power management module (e.g., the wireless charging module 250). For example, when the electronic device 101 uses a wireless charging function, the NFC communication module 230 or the wireless charging module 250 may control the switching circuit to temporarily disconnect at least one portion of the radiators shared by the NFC antenna 297-3 and the wireless charging antenna 297-5 from the NFC antenna 297-3 and to connect the at least one portion of the radiators with the wireless charging antenna 297-5.

According to an embodiment, at least one function of the MST communication module 210, the NFC communication module 230, or the wireless charging module 250 may be controlled by an external processor (e.g., the processor 120). According to an embodiment, at least one specified function (e.g., a payment function) of the MST communication module 210 or the NFC communication module 230 may be performed in a trusted execution environment (TEE). According to an embodiment, the TEE may form an execution environment in which, for example, at least some designated area of the memory 130 is allocated to be used for performing a function (e.g., a financial transaction or personal information-related function) that requires a relatively high level of security. In such a case, access to the at least some designated area of the memory 130 may be restrictively permitted, for example, according to an entity accessing thereto or an application being executed in the TEE.

Figure 3:
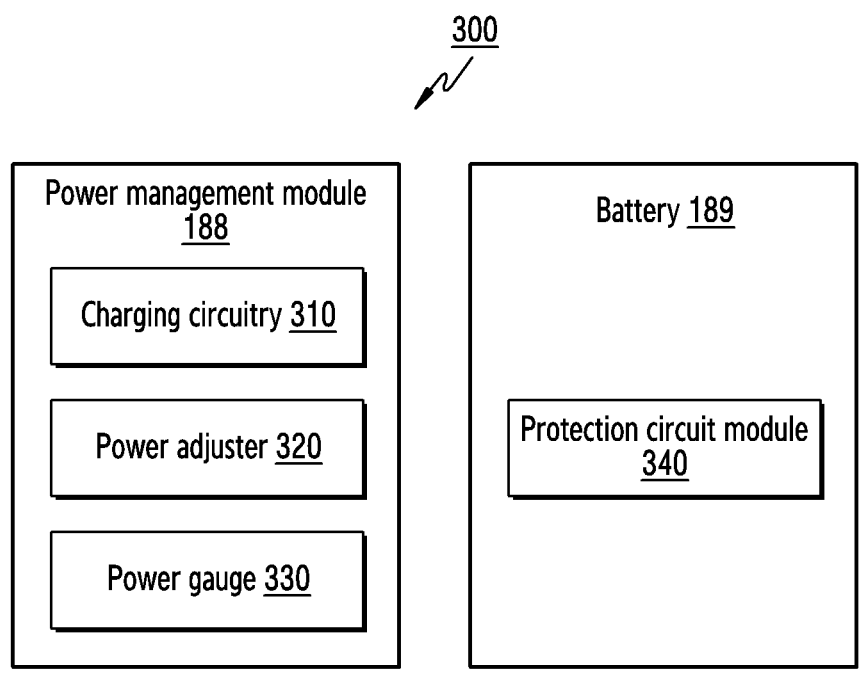
FIG. 3 is a block diagram of a power management module and a battery according to various embodiments.

FIG. 3 is a block diagram 300 illustrating the power management module 188 and the battery 189 according to various embodiments.

Referring to FIG. 3, the power management module 188 may include charging circuitry 310, a power adjuster 320, or a power gauge 330. The charging circuitry 310 may charge the battery 189 by using power supplied from an external power source outside the electronic device 101. According to an embodiment, the charging circuitry 310 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 320 may generate a plurality of powers having different voltage levels or different current levels by adjusting a voltage level or a current level of the power supplied from the external power source or the battery 189. The power adjuster 320 may adjust the voltage level or the current level of the power supplied from the external power source or the battery 189 into a different voltage level or current level appropriate for each of some of the components included in the electronic device 101. According to an embodiment, the power adjuster 320 may be implemented in the form of a low drop out (LDO) regulator or a switching regulator.

The power gauge 330 may measure use state information about the battery 189 (e.g., a capacity, a number of times of charging or discharging, a voltage, or a temperature of the battery 189).

The power management module 188 may determine, using, for example, the charging circuitry 310, the power adjuster 320, or the power gauge 330, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) 340. The PCM 340 may perform one or more of various functions (e.g., a pre-cutoff function) to prevent a performance deterioration of, or a damage to, the battery 189. The PCM 340, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 330, or the power management module 188. According to an embodiment, the corresponding sensor (e.g., a temperature sensor) of the sensor module 176 may be included as part of the PCM 340, or may be disposed near the battery 189 as a separate device.

Figure 4:
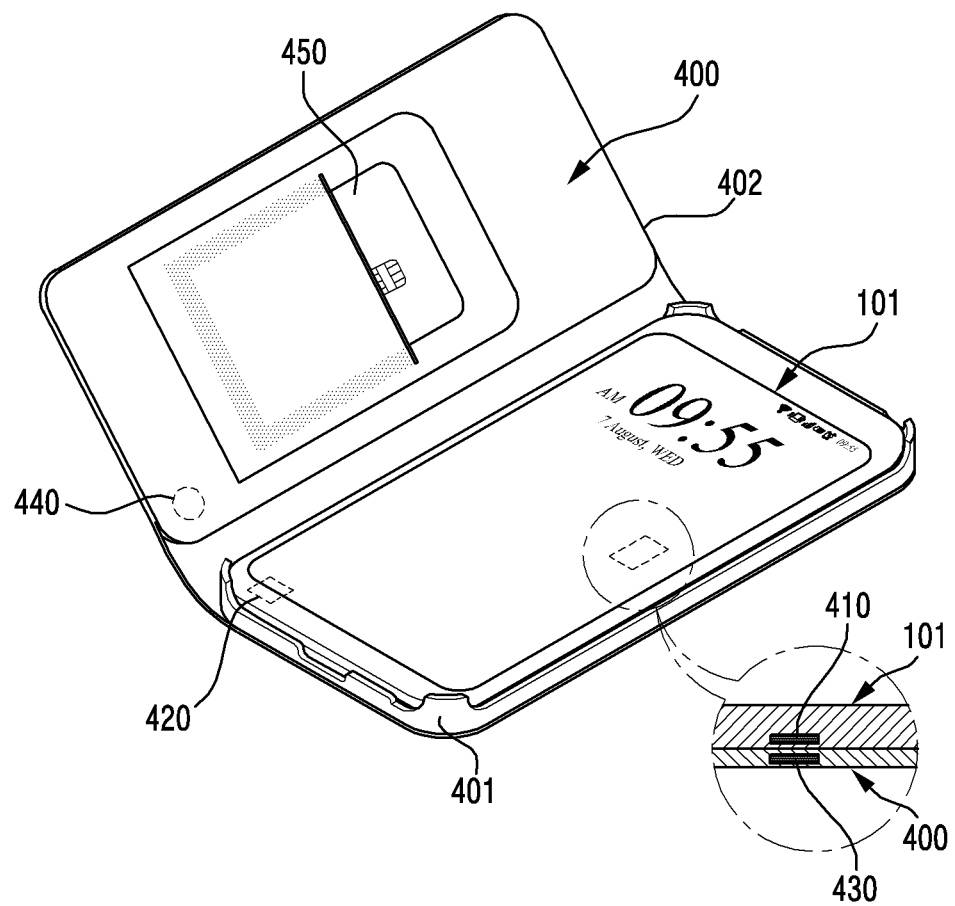
FIG. 4 shows an example of an electronic device and an external device mounted on the electronic device according to various embodiments.

FIG. 4 illustrates an example of an electronic device and an external device mounted on an electronic device according to various embodiments.

Referring to FIG. 4, the external device 400 may be a cover (or a case) that can be mounted on the electronic device 101 and encloses at least a portion of the electronic device 101. The external device 400 may include a lid 402 covering the front surface of the electronic device 101 and a fixing part 401 in contact with the back surface of the electronic device 101. When the external device 400 is mounted on the electronic device 101, the fixing part 401 of the external device 400 may be fixed while being in contact with the back surface of the electronic device 101, and the lid 402 of the external device 400 may not be fixed. For example, the lid 402 may cover the front surface of the electronic device 101 while being in contact with the same, may not cover the front surface of the electronic device 101 as shown in FIG. 4, or may be folded backwards so as to be positioned on the back surface of the electronic device 101.

The lid 402 of the external device 400 may accommodate a card 450 (e.g., a credit card, a debit card, or the like). The external device 400 may be a diary-type case, a flip cover, a wallet-type case, or the like, capable of accommodating the card 450 in at least a portion of the lid 402. The electronic device 101 may be a smart phone, a personal digital assistant (PDA), an electronic organizer, a tablet personal computer (PC), or a wearable device, and the like on which the external device 400 can be mounted.

The electronic device 101 may include a first hall integrated circuit (IC) 410 and a second hall integrated circuit (IC) 420, and the external device 400 may include a first magnet 430 and a second magnet 440. For example, the first hall IC 410 and the second hall IC 420 may be referred to as "sensors".

The first hall IC 410 of the electronic device 101 may be embedded near the back surface of the electronic device 101 so as not to cover a display of the electronic device 101. The first magnet 430 of the external device 400 may be embedded in the fixing part 401, and may be embedded at the position corresponding to the position of the first hall IC 410. The first magnet 430 may be included in the fixing part 401 so as to overlap the first hall IC 410 of the electronic device 101 when the external device 400 is mounted on the electronic device 101.

The first hall IC 410 may detect whether or not the external device 400 is mounted using a magnetic field (or magnetic flux) generated by the first magnet 430. When the external device 400 is mounted on the electronic device 101, the first hall IC 410 may sense (or detect) the magnetic field (or magnetic flux) generated by the first magnet 430. When the external device 400 is not mounted on the electronic device 101, the first hall IC 410 may not sense the magnetic field (or magnetic flux).

The second hall IC 420 of the electronic device 101 may be embedded close to the bezel of the electronic device 101 so as not to cover the display of the electronic device 101. The second magnet 440 of the external device 400 may be embedded in the lid 402 of the external device 400, and may be embedded at the position corresponding to the position of the second hall IC 420. The second magnet 440 may be included in the lid 402 so as to overlap the second hall IC 420 of the electronic the device 101 when the external device 400 is mounted on the electronic device 101 such that the lid 402 of the external device 400 covers the front surface of the electronic device 101.

The second hall IC 420 may detect a magnetic field (or magnetic flux, a first signal, or the like) generated by the second magnet 440, and may transmit the detected result to a processor (e.g., the processor 120) of the electronic device 101. The processor 120, based on the detected result, may detect the state of the external device 400 mounted on the electronic device 101. The processor 120, using the second hall IC 420, may detect one of a state in which the lid 402 of the external device 400 covers the front surface of the electronic device 101, a state in which the lid 402 is folded backwards to be positioned on the back surface of the electronic device 101, or a state in which the lid 402 does not cover the front surface of the electronic device 101 and is not positioned on the back surface of the electronic device 101.

FIG. 4 is only an example in order to describe various embodiments, and various embodiments are not limited to the shapes, positions, arrangements, and the like, of the components shown in FIG. 4.

Figure 5:
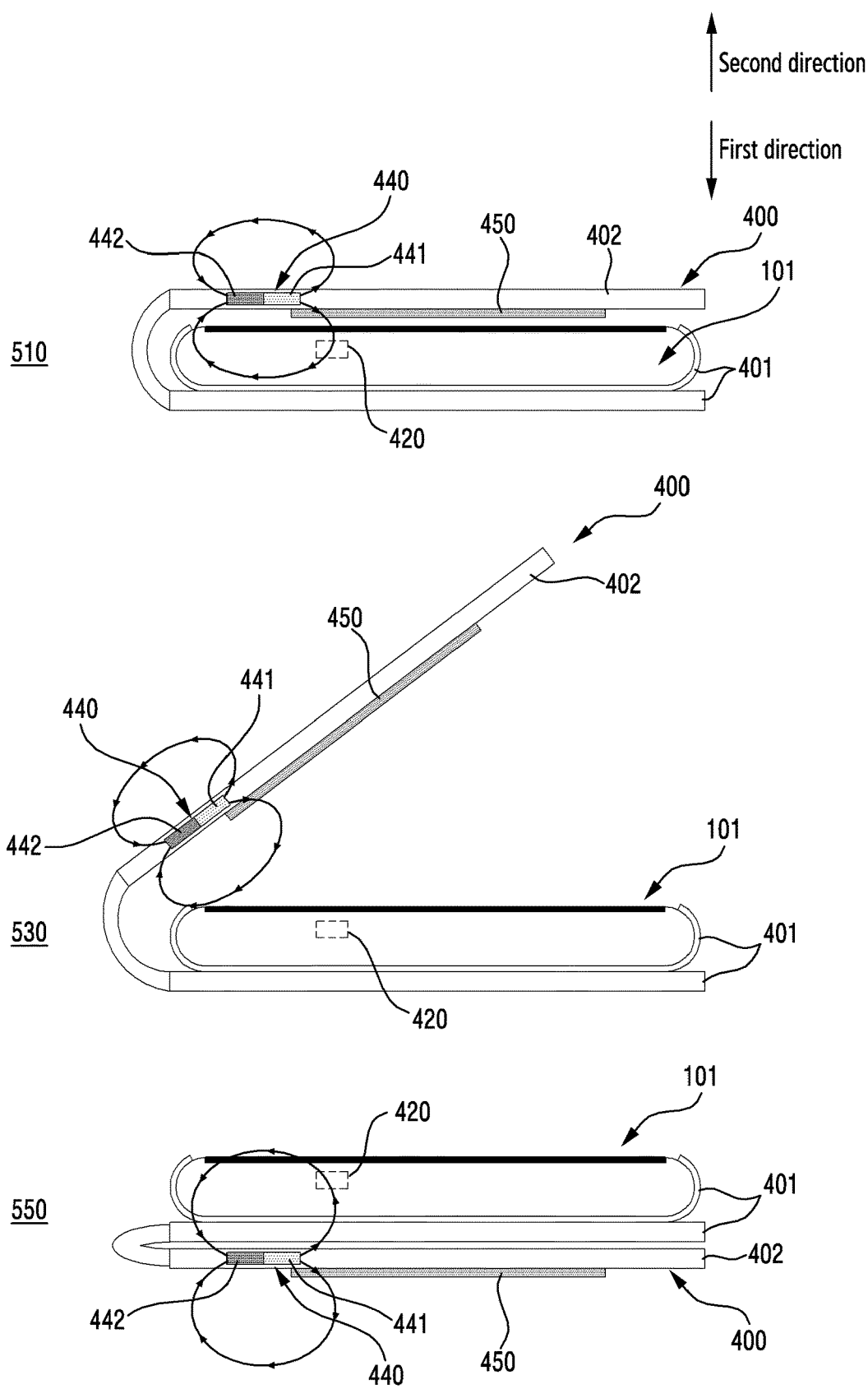
FIG. 5 shows an example of the state of an external device mounted on an electronic device according to various embodiments.

FIG. 5 illustrates an example of the state of an external device mounted on an electronic device according to various embodiments.

Referring to FIG. 5, the state of an external device 400 mounted on the electronic device 101 may include a closed state 510, an open state 530, and a backward-folded state 550.

The closed state 510 may be the state in which the lid 402 of the external device 400 covers the front surface of the electronic device 101 (or the state in which the lid 402 is in contact with the front surface of the electronic device 101). For example, the closed state 510 may be the state in which the lid 402 of the external device 400 has a rotation angle of 0 degrees with respect to the front surface of the electronic device 101. The open state 530 may be the state in which the lid 402 does not cover the front surface of the electronic device 101 (or the state in which the lid 402 is not in contact with the front surface of the electronic device 101) but is not in the backward-folded state 550. For example, the open state 530 may be the state in which the lid 402 of the external device 400 has any rotation angle of more than 0 degrees and less than 360 degrees with respect to the front surface of the electronic device 101. The backward-folded state 550 may be the state in which the lid 402 of the external device 400 is folded backwards so as to be positioned on the back surface of the electronic device 101 (or the state in which the lid 402 of the external device 400 is in contact with the fixing part 401 of the external device 400). For example, the backward-folded state 550 may be the state in which the lid 402 of the external device 400 has a rotation angle of 360 degrees with respect to the front surface of the electronic device 101 (e.g., the state in which the lid 402 is rotated by 360 degrees).

When the electronic device 101 is placed on an external wireless charging device while the state of the external device 400 is the backward-folded state 550, the card 450 contained in the lid 402 may be positioned between the electronic device 101 and the external wireless charging device. Thus, if the electronic device 101 performs a wireless charging operation in the backward-folded state 550, the card 450 may be damaged. For example, an integrated circuit (IC) included in the card 450 may be burned due to a high voltage resulting from wireless charging. For example, although the wireless charging device generally transmits a charging voltage of 5V, the electronic device 101 may not receive the full charging voltage due to the card 450, which reduces charging efficiency depending on time. Thus, the wireless charging device may increase the charging voltage to a higher voltage (e.g., 8V). In this case, although the charging efficiency of the electronic device 101 may be improved, the card 450 may be damaged due to the high voltage. In various embodiments, the electronic device 101 may not perform wireless charging if the state of the external device 400 is the backward-folded state 550.

When the state of the external device 400 is the closed state 510 or the open state 530, the card 450 contained in the lid 402 may not be damaged even if wireless charging is performed.

The processor 120 of the electronic device 101 may identify the direction of the magnetic field (or magnetic flux) generated by the second magnet 440 included in the lid 402 using the second hall IC 420 (or the sensor) in order to detect the state of the external device 400 as one of the closed state 510, the open state 530, or the backward-folded state 550. The second magnet 440 included in the lid 402 may include a first pole 441 (e.g., an N pole) and a second pole 442 (e.g., an S pole). For example, the magnetic field generated by the second magnet 440 may exit from the first pole 441 (e.g., the N pole), and may enter the second pole 442 (e.g., the S pole). The first pole 441 and the second pole 442 may be arranged side by side (or laterally) in a direction parallel to the front surface of the electronic device 101, instead of being arranged vertically. The second hall IC 420 may be positioned in an area corresponding to the end of the first pole 441 so as to sense the downward magnetic field or the upward magnetic field exiting from the first pole 441 (e.g., the N pole). The direction of the magnetic field passing through the second hall IC 420 in the closed state 510 may be different from (generally opposite to) the direction of the magnetic field passing through the second hall IC 420 in the backward-folded state 550 by disposing the first pole 441 and the second pole 442 of the second magnet 440, and the second hall IC 420 as described above.

For example, the first direction may refer to a direction that is perpendicular to the front surface of the electronic device 101 and is directed downwards, and the second direction may refer to a direction that is perpendicular to the front surface of the electronic device 101 and is directed upwards. In the closed state 510, the magnetic field passing through the second hall IC 420 may be oriented substantially in the first direction because of the magnetic field exiting from the first pole 441 of the second magnet 440 positioned above the second hall IC 420. In the backward-folded state 550, the magnetic field passing through the second hall IC 420 may be substantially in the second direction because of the magnetic field exiting from the first pole 441 of the second magnet 440 positioned below the second hall IC 420. In the open state 530, the magnetic field passing through the second hall IC 420 may not be sensed.

The second hall IC 420 may separately sense (or detect) the magnetic flux in the first direction passing through the second hall IC 420 and the magnetic flux in the second direction passing through the second hall IC 420. For example, if the magnetic flux in the first direction is detected as being equal to or greater than a predetermined intensity, and if the magnetic flux in the second direction is detected as being less than a predetermined intensity, the state of the external device 400 may be the closed state 510. If the magnetic flux in the first direction and the magnetic flux in the second direction are detected as being less than a predetermined intensity, the state of the external device 400 may be the open state 530. If the magnetic flux in the first direction is detected as being less than a predetermined intensity, and if the magnetic flux in the second direction is detected as being equal to or greater than a predetermined intensity, the state of the external device 400 may be the backward-folded state 550.

The second hall IC 420 may output a first output value for the detected magnetic flux in the first direction, and may output a second output value for the detected magnetic flux in the second direction. The first output value may vary depending on whether or not the magnetic flux in the first direction is detected as being equal to or greater than a predetermined intensity. The second output value may vary depending on whether or not the magnetic flux in the second direction is detected as being equal to or greater than a predetermined intensity. The first output value and the second output value may be used to determine that the state of the external device 400 is one of the closed state 510, the open state 530, and the backward-folded state 550. The first output value and the second output value will be described in more detail later with reference to FIGS. 8 and 9.

FIG. 5 is only an example to explain various embodiments, and the various embodiments are not limited to the shapes, positions, arrangements, and the like, of the components shown in FIG. 4. For example, the second hall IC 420 may be positioned in an area corresponding to the end of the second pole 442 (e.g., the S pole), and may detect the magnetic field entering the second pole 442 (e.g., the S pole). Alternatively, the positions of the first pole 441 and the second pole 442 may be exchanged.

Figure 6:
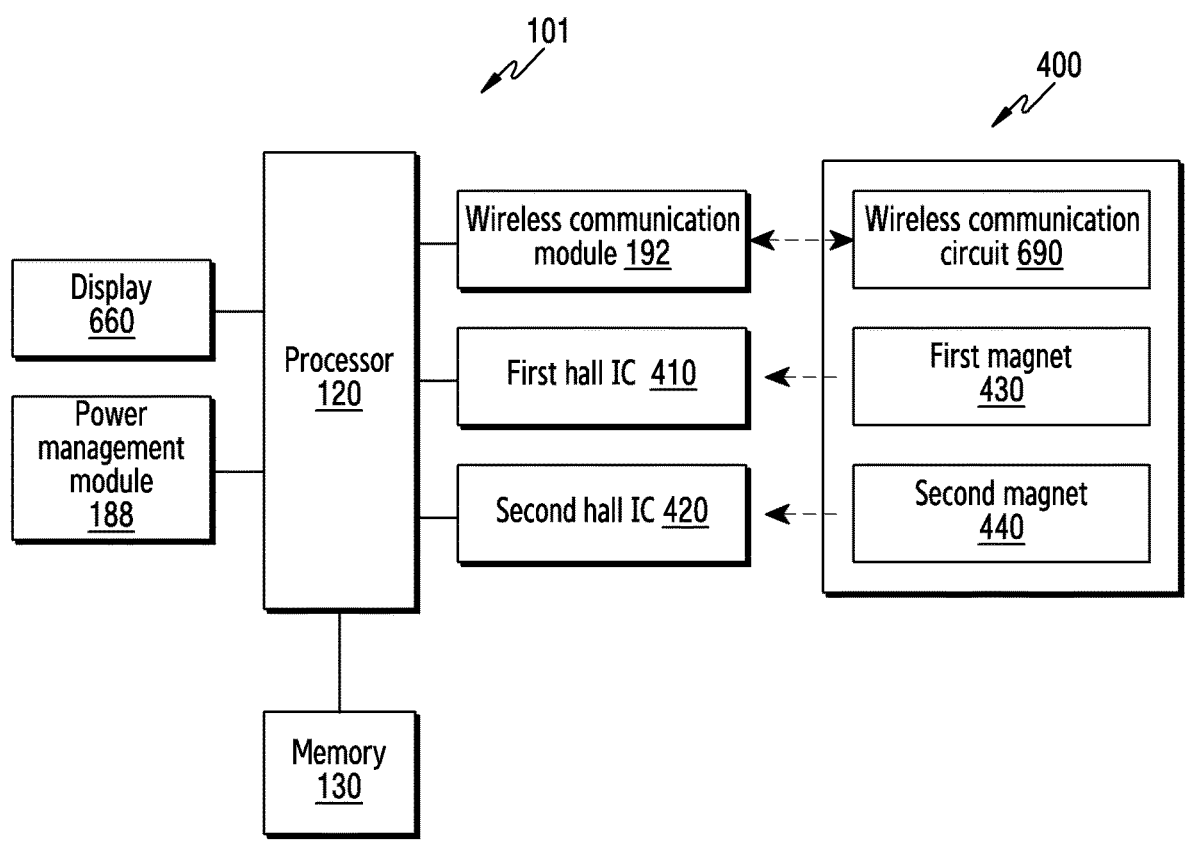
FIG. 6 shows an example of functional configurations of an electronic device and an external device according to various embodiments.

FIG. 6 illustrates an example of functional configurations of an electronic device and an external device according to various embodiments.

Referring to FIG. 6, the electronic device 101 may include a first hall IC 410, a second hall IC 420, a processor 120, a wireless communication module 192, a power management module 188, a display 660, and a memory 130. However, the present disclosure is not limited thereto, and some elements may be excluded.

The first hall IC 410 may detect whether or not the external device 400 has been mounted on the electronic device 101. More specifically, when the external device 400 is mounted on the electronic device 101, the magnetic field generated by the first magnet 430 positioned to correspond to the first hall IC 410 may pass through the first hall IC 410. In response to the detection of the magnetic field, the first hall IC 410 may output an output value indicating that the magnetic field has been detected to the processor 120. For example, the first hall IC 410 may output a first value (e.g., "high" or 1) to the processor 120 if the magnetic field is detected as being less than a predetermined intensity. The first hall IC 410 may output a second value (e.g., "low" or 0) to the processor 120 if the magnetic field is detected as being equal to or greater than a predetermined intensity. However, the present disclosure is not limited thereto, and the first value and the second value may be exchanged according to implementation.

The second hall IC 420 (or a sensor) may output a detected value (e.g., an output value) depending on the state of the external device 400 (e.g., one of the closed state 510, the open state 530, and the backward-folded state 550). More specifically, the second hall IC 420 may sense (or detect) the magnetic flux in the first direction passing through the second hall IC 420 and the magnetic flux in the second direction passing through the second hall IC 420, respectively. The second hall IC 420 may output a first output value for the detected magnetic flux in the first direction, and may output a second output value for the detected magnetic flux in the second direction. For example, the second hall IC 420 may output a first output value as a first value (e.g., "high" or 1) if the magnetic flux in the first direction is detected as being less than a predetermined intensity. The second hall IC 420 may output a first output value as a second value (e.g., "low" or 0) if the magnetic flux in the first direction is detected as being equal to or greater than a predetermined intensity. The second hall IC 420 may output a second output value as a first value (e.g., "high" or 1) if the magnetic flux in the second direction is detected as being less than a predetermined intensity. The second hall IC 420 may output a second output value as a second value (e.g., "low" or 0) if the magnetic flux in the second direction is detected as being equal to or greater than a predetermined intensity. However, the present disclosure is not limited thereto, and the first value and the second value may be exchanged.

The second hall IC 420, based on the detected magnetic flux in the first direction and the detected magnetic flux in the second direction, may output a first output value and a second output value to the processor 120. The first output value and the second output value may be used to determine that the state of the external device 400 is one of the closed state 510, the open state 530, and the backward-folded state 550.

In some embodiments, the second hall IC 420 may include a first output pin that outputs a first output value and a second output pin that outputs a second output value. The second hall IC 420 may simultaneously output the first output value for the magnetic flux in the first direction through the first output pin and the second output value for the magnetic flux in the second direction through the second output pin.

In some other embodiments, the second hall IC 420 may include a control pin, which can switch between the first value and the second value, and a single output pin. The second hall IC 420 may detect the magnetic flux in the first direction when the control pin is set to a first value (e.g., "high" or 1) by the processor 120. Thus, the second hall IC 420 may output the first output value for the magnetic flux in the first direction through the output pin when the control pin is set to the first value (e.g., "high" or 1). The second hall IC 420 may detect the magnetic flux in the second direction when the control pin is set to a second value (e.g., "low" or 0) by the processor 120. Thus, the second hall IC 420 may output the second output value for the magnetic flux in the second direction through the output pin when the control pin is set to the second value (e.g., "low" or 0).

The processor 120 may control the overall operation of the electronic device 101. The processor 120 may receive commands of other elements (e.g., the first hall IC 410, the second hall IC 420, the wireless communication module 192, the power management module 188, the display 660, and the memory 130), may interpret the received commands, and may perform calculations or data processing according to the interpreted commands. The processor 120 may be implemented by software, hardware, such as a chip, circuitry, or the like, or a combination of software and hardware. A single processor 120 may be provided, or one, or a plurality of processors provided as a combination.

The processor 120 may receive an output value from the first hall IC 410. The processor 120, based on the output value received from the first hall IC 410, may determine whether or not the external device 400 has been mounted. For example, when a first value (e.g., "high" or 1) is received from the first hall IC 410, the processor 120 may determine that the external device 400 has been detached. When a second value (e.g., "low" or 0) is received from the first hall IC 410, the processor 120 may determine that the external device 400 has been mounted. However, the present disclosure is not limited thereto, and the first value and the second value may be exchanged according to implementation.

The processor 120 may control the wireless communication module 192 in order to determine the type of external device 400. For example, in response to a determination that the external device 400 has been mounted, the processor 120 may control an NFC communication module 230 so as to receive a signal through an NFC antenna 297-3 in order to perform authentication of the external device 400. Based on the signal received from the external device 400 through the NFC antenna 297-3, the processor 120 may determine the type of external device 400. For example, the processor 120 may determine whether or not the external device 400, which has been mounted on the electronic device 101, is a cover including a lid 402 for accommodating a card 450 (e.g., a diary-type case, a flip cover, a wallet-type case, or the like).

The processor 120 may control the second hall IC 420 so as to detect magnetic flux in the first direction and magnetic flux in the second direction. The processor 120 may control the second hall IC 420 so as to output a first output value for the magnetic flux in the first direction and a second output value for the magnetic flux in the second direction. For example, the processor 120 may determine that the external device 400 mounted on the electronic device 101 is a cover including a lid 402 for accommodating a card 450. The processor 120 may detect (or determine) the state of the external device 400 using the second hall IC 420 in response to the above determination. For example, the processor 120 may control the second hall IC 420 so as to sense magnetic flux in the first direction and magnetic flux in the second direction, or may control the second hall IC 420 so as to output a first output value and a second output value. The processor 120, based on the output values (e.g., the first output value and the second output value) output from the second hall IC 420, may determine that the state of the external device 400 is one of the closed state 510, the open state 530, and the backward-folded state 550. As another example, in response to reception of a signal for performing wireless charging through the power management module 188, the processor 120 may control the second hall IC 420 so as to detect the magnetic flux in the first direction and the magnetic flux in the second direction, or may control the second hall IC 420 so as to output the first output value and the second output value in order to determine that the state of the external device 400 as one of the closed state 510, the open state 530, and the backward-folded state 550.

In some embodiments, the processor 120 may control the second hall IC 420 so as to output a first output value through the first output pin of the second hall IC 420 and so as to output a second output value through the second output pin of the second hall IC 420.

In some other embodiments, the processor 120 may switch a set value of the control pin of the second hall IC 420 between the first value and the second value. When the control pin is set to the first value (e.g., "high" or 1), the processor 120 may control the second hall IC 420 so as to detect the magnetic flux in the first direction, and may control the second hall IC 420 so as to output a first output value for the magnetic flux in the first direction through the output pin. When the control pin is set to the second value (e.g., "low" or 0), the processor 120 may control the second hall IC 420 so as to detect the magnetic flux in the second direction, and may control the second hall IC 420 so as to output a second output value for the magnetic flux in the second direction through the output pin. For example, the processor 120 may periodically switch a set value of the control pin between the first value and the second value. For example, the processor 120 may control the control pin such that switching is started in response to a determination that the external device 400 mounted on the electronic device 101 is to a cover including a lid 402 for accommodating a card 450.

The processor 120 may receive the first output value and the second output value from the second hall IC 420. For example, in response to a determination that the external device 400 mounted on the electronic device 101 corresponds to a cover including a lid 402 for accommodating a card 450, the processor 120 may receive the first output value and the second output value in order to determine that the state of the external device 400 is one of the closed state 510, the open state 530, and the backward-folded state 550.

Based on the received first output value and second output value, the processor 120 may determine that the state of the external device 400 is one of the closed state 510, the open state 530, and the backward-folded state 550. For example, if the first output value is a second value (e.g., "low" or 0), and if the second output value is a first value (e.g., "high" or 1), the processor 120 may determine that the state of the external device 400 is the closed state 510. If the first output value is the first value (e.g., "low" or 0), and if the second output value is the first value ("low" or 0), the processor 120 may determine that the state of the external device 400 is the open state 530. If the first output value is the first value (e.g., "high" or 1), and if the second output value is the second value ("low" or 0), the processor 120 may determine that the state of the external device 400 is the backward-folded state 550.

The processor 120 may activate or deactivate the wireless charging module 250 (e.g., the wireless charging circuit) included in the power management module 188. When the wireless charging module 250 is activated, the wireless charging module 250 may receive a signal (e.g., a ping) for performing wireless charging from an external wireless charging device, and may transmit a response to the received signal to the external wireless charging device. When the wireless charging module 250 is deactivated, the wireless charging module 250 neither receives a signal (e.g., a ping) for performing wireless charging from the external wireless charging device nor transmits a response to the received signal to the external wireless charging device. Thus, when the wireless charging module 250 is deactivated, the wireless charging may not be performed.

For example, in response to a determination that the state of the external device 400 is the backward-folded state 550, the processor 120 may deactivate the wireless charging circuit (e.g., the wireless charging module 250 or the charging circuit 310) of the power management module 188. Therefore, when the card 450 is accommodated in the lid 402 in the backward-folded state 550, the processor 120 may prevent the card 450 from being damaged by blocking the wireless charging. When the state of the external device 400 is determined to be the closed state 510 or the open state 530, the processor 120 may activate the wireless charging circuit of the power management module 188. This is due to the fact that the card 450 accommodated in the lid 402 may not be damaged by the wireless charging in the closed state 510 or the open state 530.

The processor 120 may control a display 660 (e.g., the display device 160). The processor 120 may activate or deactivate the display 660. The activated state of the display 660 may refer to the state in which the display 660 is turned on and displays information therethrough. The deactivated state of the display 660 may refer to an idle state or a sleep mode in which the display 660 is turned off and cannot display information even though the electronic device 101 is turned on.

For example, in response to a determination that the state of the external device 400 is the closed state 510, the processor 120 may deactivate the display 660. In response to a determination that the state of the external device 400 is the open state 530 or the backward-folded state 550, the processor 120 may activate the display 660.

In some embodiments, in response to a determination that the state of external device 400 is the backward-folded state 550 and/or in response to reception of a signal for wireless charging, the processor 120 may control the display 660 so as to display a user interface in order to prompt the removal of the card 450.

The wireless communication module 192 may perform wireless communication through an antenna. For example, the NFC communication module 230 included in the wireless communication module 192 may perform wireless communication with the external device 400 through the NFC antenna 297-3. The NFC communication module 230 may transmit and receive signals through the NFC antenna 297-3 to perform authentication of the external device 400. The NFC communication module 230 may receive a signal including information on the type of external device 400 from the wireless communication circuit 690 (e.g., an NFC authentication chip) included in the external device 400. The wireless communication module 192 (e.g., the NFC communication module 230) may transmit information on the received signal or on the type of external device 400 to the processor 120.

The power management module 188 may manage power supplied to the electronic device 101. The power management module 188 may include a wireless charging module 250 {for example, a wireless charging circuitry (e.g., the charging circuit 310)} in order to receive power wirelessly from an external wireless charging device. The wireless charging module 250 may receive a signal (e.g., a ping) to perform wireless charging from the external wireless charging device through a wireless charging antenna 297-5. The signal (e.g., a ping) to perform wireless charging may be used to determine whether or not an object placed on the external wireless charging device is a power receiver (e.g., the electronic device 101). The signal (e.g., a ping) to perform wireless charging may be used to determine whether or not the power receiver (e.g., the electronic device 101) requires power reception.

The wireless charging module 250 may transmit, to the external wireless charging device, a response to the received signal (e.g., a ping) through the wireless charging antenna 297-5. The wireless charging module 250 may receive power wirelessly from the external wireless charging device through the wireless charging antenna 297-5.

The display 660 may display a screen of the electronic device 101 according to the control of the processor 120. For example, when the state of the external device 400 is the closed state 510, the display 660 may be turned off. When the state of the external device 400 is the open state 530 or the backward-folded state 550, the display 660 may be turned on. The display 660 may display various pieces of information according to the control of the processor 120. In some embodiments, when the state of the external device 400 is the backward-folded state 550 and/or when a signal for wireless charging is received, the display 660 may display a user interface in order to guide removal of the card 450.

The memory 130 may refer to a set of one or more memories. The memory 130 may execute instructions stored in the memory 130, based on signaling with the processor 120. The memory 130 may store data and/or commands received from or generated by other elements (e.g., the processor 120, the first hall IC 410, the second hall IC 420, the wireless communication module 192, the power management module 188, the display 660, and the like). For example, the memory 130 may store a first output value and a second output value received from the second hall IC 420.

The external device 400 may include the first magnet 430, the second magnet 440, and the wireless communication circuit 690. However, the present disclosure is not limited thereto, and some elements may be excluded or other elements may be further added.

The first magnet 430 may generate a magnetic field. The magnetic field generated by the first magnet 430 may pass through the first hall IC 410 when the external device 400 is mounted on the electronic device 101. The first magnet 430 may be included in the fixing part 401 of the external device 400 so as to be used for the electronic device 101 to determine whether or not the external device 400 has been mounted thereon.

The second magnet 440 may generate a magnetic field. The second magnet 440 may be included in the lid 402 of the external device 400 so as to be used for the electronic device 101 to determine that the state of the external device 400 is one of the closed state 510, the open state 530, and the backward-folded state 550. For example, when the external device 400 is in the closed state 510, the magnetic field generated by the second magnet 440 may pass through the second hall IC 420 substantially in the first direction. When the external device 400 is in the backward-folded state 550, the magnetic field generated by the second magnet 440 may pass through the second hall IC 420 substantially in the second direction. When the external device 400 is in the open state 530, almost none of the magnetic field generated by the second magnet 440 may pass through the second hall IC 420.

The wireless communication circuit 690 (e.g., an NFC chip) may perform authentication of the external device 400. The wireless communication circuit 690 may transmit a signal to the wireless communication module 192 of the electronic device 101. The wireless communication circuit 690 may transmit, to the wireless communication module 192, a signal including information on the type of external device 400 (e.g., a diary-type case, a flip-cover, a wallet-type case, and the like).

An electronic device (e.g., the electronic device 101) according to various embodiments described above may include: a hall integrated circuit (IC) (e.g., the second hall IC 420) configured to detect magnetic flux generated by an external device (e.g., the external device 400) enclosing at least a portion of the electronic device; a wireless charging circuit (e.g., the wireless charging module 250 of the power management module 188 or charging circuit 310 of the power management module 188); and at least one processor (e.g., the processor 120) configured to be connected to the hall IC and the wireless charging circuit, wherein the at least one processor may be configured to: receive an output value for the detected magnetic flux from the hall IC; and control the wireless charging circuit, based on the output value.

In various embodiments, the at least one processor may be configured to deactivate the wireless charging circuit if the output value corresponds to the state in which a lid (e.g., the lid 402) of the external device is folded backwards (e.g., the backward-folded state 550).

In various embodiments, the output value may include a first output value for magnetic flux in a first direction and a second output value for magnetic flux in a second direction opposite the first direction, among the magnetic flux generated by the external device. In some embodiments, the hall IC may include a first output pin configured to output the first output value and a second output pin configured to output the second output value. In some other embodiments, the hall IC may include a switching pin and an output pin, wherein the output pin is configured to output the first output value for the magnetic flux in the first direction when the switching pin is set to a first value, and wherein the output pin is configured to output the second output value for the magnetic flux in the second direction when the switching pin is set to a second value. For example, the at least one processor may be configured to periodically switch the switching pin between the first value and the second value.

In various embodiments, the at least one processor may be configured to determine whether the lid of the external device is in one of a closed state (e.g., the closed state 510), an open state (e.g., the open state 530), or a backward-folded state (e.g., the backward-folded state 550), based on the output value.

In various embodiments, the at least one processor may be configured to: in response to reception of a signal for wireless charging, determine whether or not the lid of the external device is in a backward-folded state, based on the output value; and in response to a determination that the lid of the external device is in the backward-folded state, deactivate the wireless charging circuit In various embodiments, the at least one processor may be configured to display a user interface prompting for removal of a card accommodated in the lid when a signal for wireless charging is received, and when the output value corresponds to the state in which the lid of the external device is folded backwards.

In various embodiments, the magnetic flux detected by the hall IC may be in a first direction when the lid of the external device is closed, and may be in a second direction opposite the first direction when the lid of the external device is folded backwards.

Figure 7:
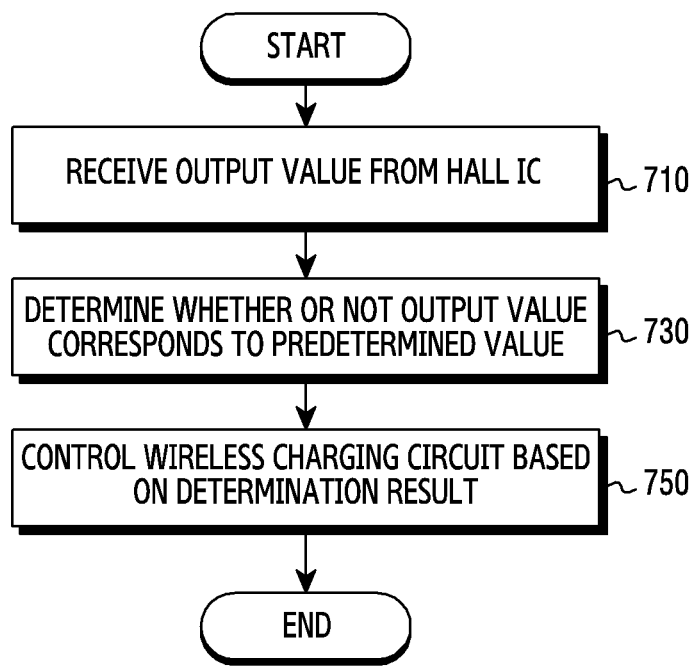
FIG. 7 shows an example of the operation of an electronic device according to various embodiments.

FIG. 7 shows an example of the operation of an electronic device according to various embodiments.

Referring to FIG. 7, the processor 120 may receive output values (e.g., a first output value and a second output value) from a hall IC (e.g., the second hall IC 420) in operation 710.

In some embodiments, the processor 120 may simultaneously receive a first output value for the magnetic flux in the first direction from a first output pin of the second hall IC 420 and a second output value for the magnetic flux in the second direction from a second output pin thereof.

In some other embodiments, the processor 120 may switch a control pin of the second hall IC 420 between a first value (e.g., "high" or 1) and a second value (e.g., "low" or 0). When the control pin is set to the first value, the processor 120 may receive a first output value for the magnetic flux in the first direction from the output pin of the second hall IC 420. When the control pin is set to the second value, the processor 120 may receive a second output value for the magnetic flux in the second direction from the output pin.

In operation 730, the processor 120 may determine whether or not the output values (e.g., the first output value and the second output value) correspond to a predetermined value. Based on the received first and second output values, the processor 120 may determine that the state of the external device 400 as one of a closed state 510, an open state 530, and a backward-folded state 550. A method for determining the state of the external device 400, based on the first and second output values, will be described in detail later with reference to FIGS. 8 and 9.

In operation 750, based on the determination result, the processor 120 may control a wireless charging circuit (e.g., the wireless charging module 230). For example, if the first output value and the second output value indicate the backward-folded state 550 of the external device 400, the processor 120 may deactivate the wireless charging circuit. If the first output value and the second output value indicate the closed state 510 or the open state 530 of the external device 400, the processor 120 may activate the wireless charging circuit.

For example, if the external device 400 is in the closed state 510, the processor 120 may determine that the first output value is a second value (e.g., low or 0) and the second output value is a first value (e.g., "high" or 1).

Based on the received first and second output values, the processor 120 may determine that the state of the external device 400 is one of a closed state 510, an open state 530, and a backward-folded state 550. For example, if the first output value is a second value (e.g., "low" or 0), and if the second output value is a first value (e.g., high or 1), the processor 120 may determine that the state of the external device 400 is the closed state 510. If the first output value is a first value (e.g., "high" or 1), and if the second output value is a first value ("high" or 1), the processor 120 may determine that the state of the external device 400 is the open state 530. If the first output value is a first value (e.g., "high" or 1), and if the second output value is a second value ("low" or 0), the processor 120 may determine that the state of the external device 400 is the backward-folded state 550.

Figure 8:
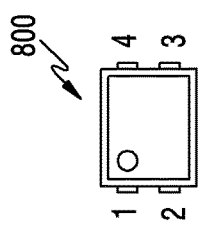
FIG. 8 shows an example of a hall IC and an example of an output value depending on detected magnetic flux according to some embodiments.
Figure 8:
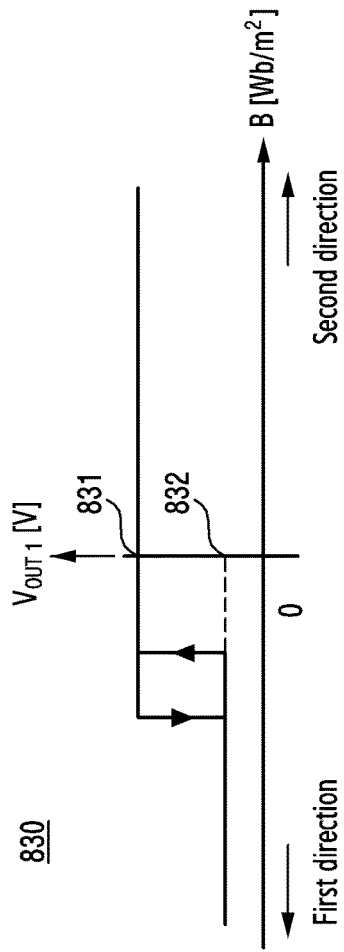
Figure 8:
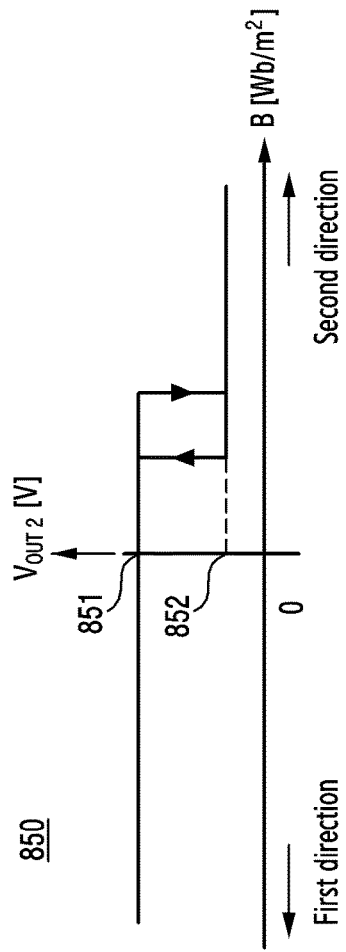

FIG. 8 shows an example of a hall IC and an example of an output value depending on detected magnetic flux according to some embodiments. The hall IC 800 may correspond to the second hall IC 420.

Referring to FIG. 8, Table 810 shows functions of the pins included in the hall IC 800, Graph 830 represents a first output value of the first output pin depending on the detected magnetic flux, and Graph 850 may represent a second output value of the second output pin depending on the detected magnetic flux.

Referring to Table 810, power may be input through a VDD pin of the hall IC 800. The VSS pin of the hall IC 800 may be grounded. The first output pin of the hall IC 800 may output a first output value for the magnetic flux in the first direction. The second output pin of the hall IC 800 may output a second output value for the magnetic flux in the second direction.

The horizontal axis of Graph 830 may represent the magnetic field (or magnetic flux) passing through the hall IC 800, and the vertical axis thereof may represent a first output value output through the first output pin. The first output pin may output only a value for the result of detecting the magnetic flux in the first direction. For example, if the magnetic flux in the first direction is equal to or greater than a predetermined value, a second value 832 (e.g., "low" or 0) may be output. If the magnetic flux in the first direction is less than a predetermined value, a first value 831 (e.g., "high" or 1) may be output.

The horizontal axis of Graph 850 may represent the magnetic field (or magnetic flux) passing through the hall IC 800, and the vertical axis thereof may represent a second output value output through the second output pin. The second output pin may output only a value for the result of detecting the magnetic flux in the second direction. For example, if the magnetic flux in the second direction is equal to or greater than a predetermined value, a second value 852 (e.g., "low" or 0) may be output. If the magnetic flux in the second direction is less than a predetermined value, a first value 851 (e.g., "high" or 1) may be output.

TABLE 1

| State of external device | First output values | Second output values |
| --- | --- | --- |
| Closed state | low | high |
| Open state | high | high |
| Backward-folded state | high | low |

Referring to Table 1, when the external device 400 is in the closed state 510, since the magnetic field passing through the hall IC 800 is substantially in the first direction, the first output value may be the second value 832, and the second output value may be the first value 851. When the external device 400 is in the open state 530, since the magnetic field passing through the hall IC 800 is very close to zero, the first output value may be the first value 831, and the second output value may be the first value 831. When the external device 400 is in the backward-folded state 550, since the magnetic field passing through the hall IC 800 is oriented substantially in the second direction, the first output value may be the first value 831, and the second output value may be the second value 852.

The processor 120, based on the first output value and the second output value output from the hall IC 800, may determine that the state of the external device 400 as one of the closed state 510, the open state 530, and the backward-folded state 550.

However, this is merely an example for explanation, and the present disclosure is not limited thereto. The first output value and the second output value may be exchanged depending on the implementation, and the first direction and the second direction may also vary depending on the arrangement of the second magnet 440.

Figure 9:
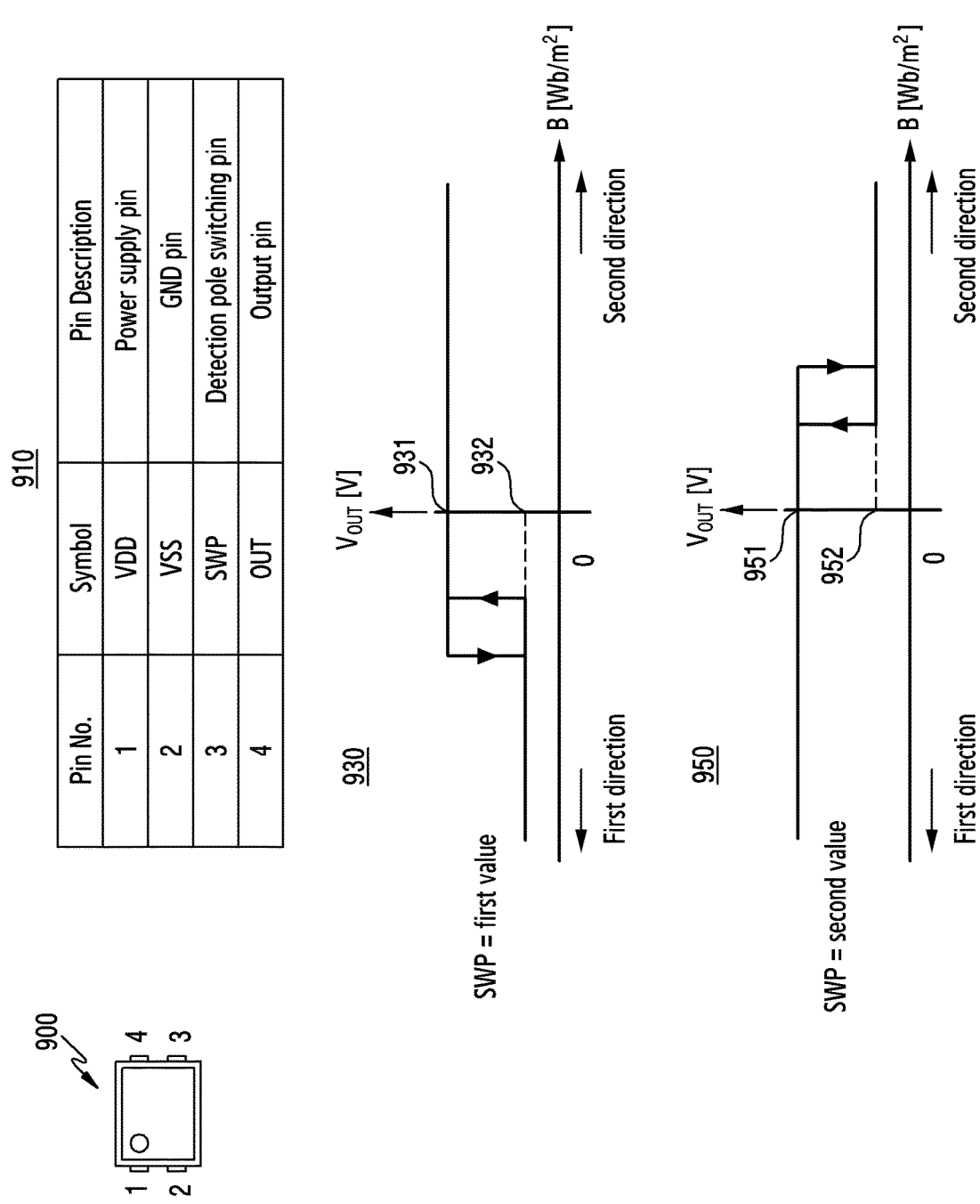
FIG. 9 shows an example of a hall IC and an example of an output value depending on detected magnetic flux according to some other embodiments.

FIG. 9 shows an example of a hall IC and an example of an output value depending on detected magnetic flux according to some other embodiments. A hall IC 900 may correspond to the second hall IC 420.

Referring to FIG. 9, Table 910 shows functions of the pins included in hall IC 900, Graph 930 represents an output value when a switching pin (or control pin) is set to a first value, and a graph 950 may represent an output value when the switching pin (or control pin) is set to a second value.

Referring to Table 910, power may be input through a VDD pin of the hall IC 900. A VSS pin of the hall IC 900 may be grounded. An SWP pin of the hall IC 900 may switch between a first value and a second value under the control of the processor 120. When the SWP pin is set to a first value (e.g., "high" or 1), the hall IC 900 can detect only the magnetic flux in the first direction, and may output a value for the magnetic flux in the first direction through the output pin. When the SWP pin is set to a second value (e.g., "low" or 0), the hall IC 900 may detect only the magnetic flux in the second direction, and may output a value for the magnetic flux in the second direction through the output pin. The SWP pin may be referred to as a "switching pin" or a "control pin".

The horizontal axis of Graph 930 may represent the magnetic field (or magnetic flux) passing through the hall IC 900, and the vertical axis thereof may represent an output value output through the output pin when the SWP pin is set to a first value (e.g., "high" or 1). For example, if the magnetic flux in the first direction is equal to or greater than a predetermined value, the output pin may output a second value 932 (e.g., "low" or 0). If the magnetic flux in the first direction is less than a predetermined value, the output pin may output a first value 931 (e.g., "high" or 1).

The horizontal axis of Graph 950 may represent the magnetic field (or magnetic flux) passing through the hall IC 900, and the vertical axis thereof may represent an output value output through the output pin when the SWP pin is set to a second value (e.g., "low" or 0). For example, if the magnetic flux in the second direction is equal to or greater than a predetermined value, the output pin may output a second value 952 (e.g., "low" or 0). If the magnetic flux in the second direction is less than a predetermined value, the output pin may output a first value 951 (e.g., "high" or 1).

The output value may be referred to as a "first output value" when the SWP pin is set to the first value, and the output value may be referred to as a "second output value" when the SWP pin is set to the second value. In this case, the hall IC 900 may output the output values as shown in Table 1 depending on the state of the external device 400. The processor 120, based on the first output value and the second output value output from the hall IC 900, may determine that the state of the external device 400 is one of the closed state 510, the open state 530, and the backward-folded state 550.

Figure 10:
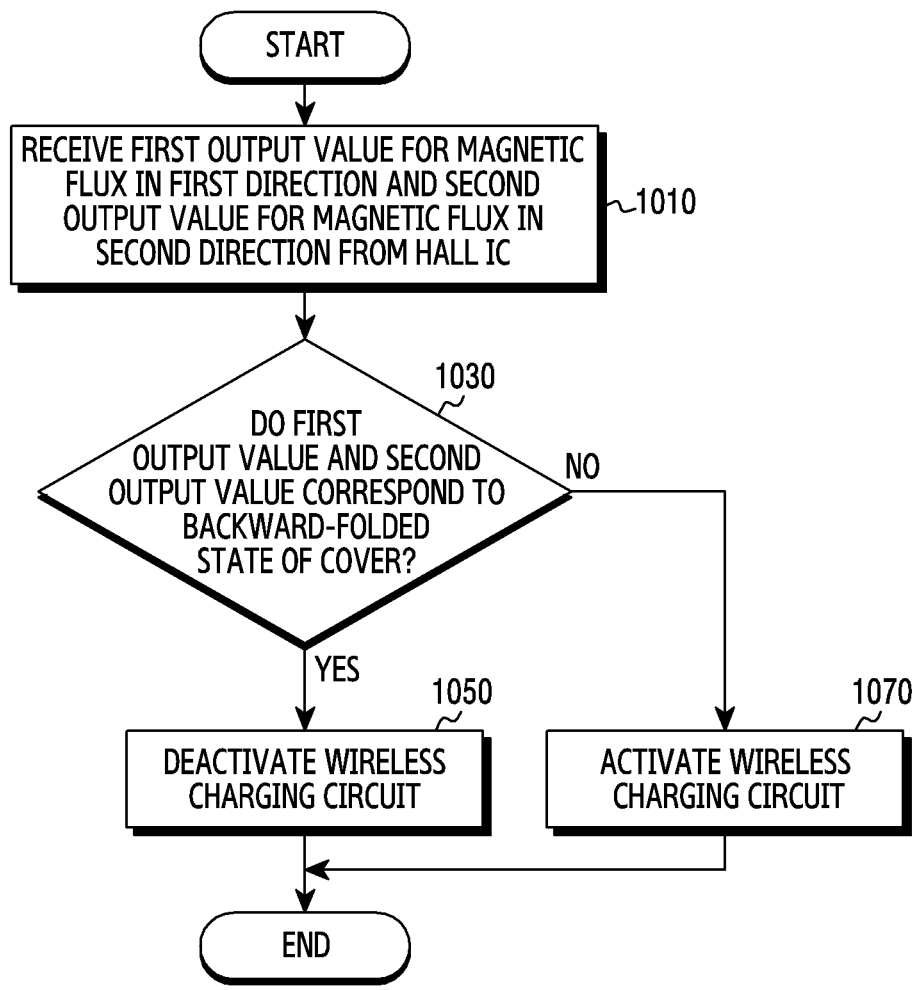
FIG. 10 shows an example of an operation of controlling a wireless charging circuit in an electronic device according to various embodiments.

FIG. 10 shows an example of an operation of controlling a wireless charging circuit in an electronic device according to various embodiments.

Referring to FIG. 10, in operation 1010, the processor 120 may receive, from a hall IC (e.g., the second hall IC 420, the hall IC 800, or the hall IC 900), a first output value for the magnetic flux in the first direction and a second output value for the magnetic flux in the second direction.

In some embodiments, the processor 120 may receive a first output value from the first output pin of the hall IC 800 according to the graph 830, and may receive a second output value from the second output pin of the hall IC 800 according to the graph 850. In some other embodiments, the processor 120 may receive a first output value from the output pin of the hall IC 900 according to the graph 930, and may receive a second output value from the output pin of the hall IC 900 according to the graph 950.

In operation 1030, the processor 120 may determine whether or not the received first output value and second output value correspond to the backward-folded state 550 of the external device 400. For example, if the first output value and the second output value are ("high" and "low") or (1 and 0), the processor 120 may determine that the external device 400 is in the backward-folded state 550.

If the received first output value and second output value are ("high" and "low") or (1 and 0), the processor 120 may deactivate the wireless charging circuit (e.g., the wireless charging module 250) in operation 1050. Since the wireless charging circuit is deactivated, wireless charging may not be performed. Accordingly, it is possible to prevent the card 450 contained in the lid 402 of the external device 400 from being damaged by a high voltage caused by wireless charging.

If the received first output value and second output value are not ("high" and "low") {or (1 and 0)}, the processor 120 may activate the wireless charging circuit in operation 1070. For example, if the first output value and the second output value are ("high" and "high") {or (1 and 1)} or ("low" and "high") {or (0 and 1)}, the processor 120 may activate the wireless charging circuit. Since the wireless charging circuit is activated, when the electronic device 101 is placed on an external wireless charging device, wireless charging can be performed. If the state of the external device 400 is the closed state 510 or the open state 530, the card 450 may not be damaged even if wireless charging is performed.

Figure 11:
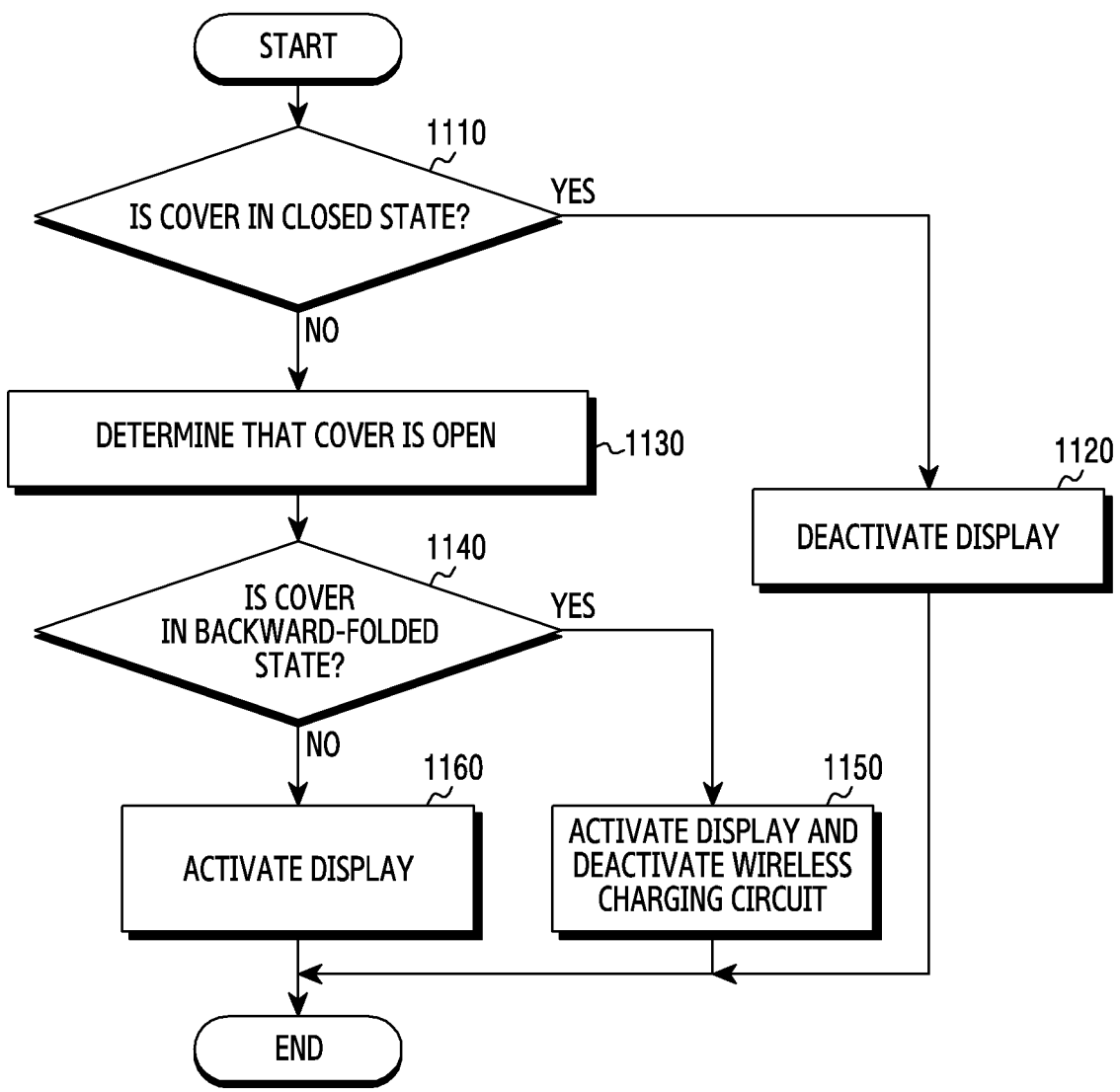
FIG. 11 shows an example of an operation in which an electronic device controls a display according to various embodiments.

FIG. 11 shows an example of an operation in which an electronic device controls a display according to various embodiments.

Referring to FIG. 11, operation 1110 may be performed after operation 710 in FIG. 7 or operation 1010 in FIG. 10. In operation 1110, the processor 120, based on the received first output value and second output value, may determine whether or not the state of the external device 400 is the closed state 510. For example, if the first output value and the second output value are ("low" and "high") or (0 and 1), the processor 120 may determine that the state of the external device 400 is the closed state 510.

In response to a determination that the state of the external device 400 is the closed state 510, the processor 120 may deactivate the display 660 in operation 1120.

In response to a determination that the state of the external device 400 is not the closed state 510, the processor 120 may determine that the cover of external device 400 is open in operation 1130. The case where the cover of the external device 440 is open may include the open state 530 and the backward-folded state 550.

In operation 1140, the processor 120, based on the received first output value and second output value, may determine whether or not the state of the external device 400 is the backward-folded state 550. For example, if the first output value and the second output value are ("high" and "low") or (1 and 0), the processor 120 may determine that the state of the external device 400 is the backward-folded state 550.

In response to a determination that the state of the external device 400 is the backward-folded state 550, the processor 120 may activate the display 660 and deactivate the wireless charging circuit in operation 1150.

In response to a determination that the state of the external device 400 is not the backward-folded state 550, the processor 120 may activate display 660 in operation 1160. For example, if the first output value and the second output value are ("high" and "high") or (1 and 1), the processor 120 may determine that the state of the external device 400 is the open state 530, and may activate the display 660 and the wireless charging circuit.

Figure 12:
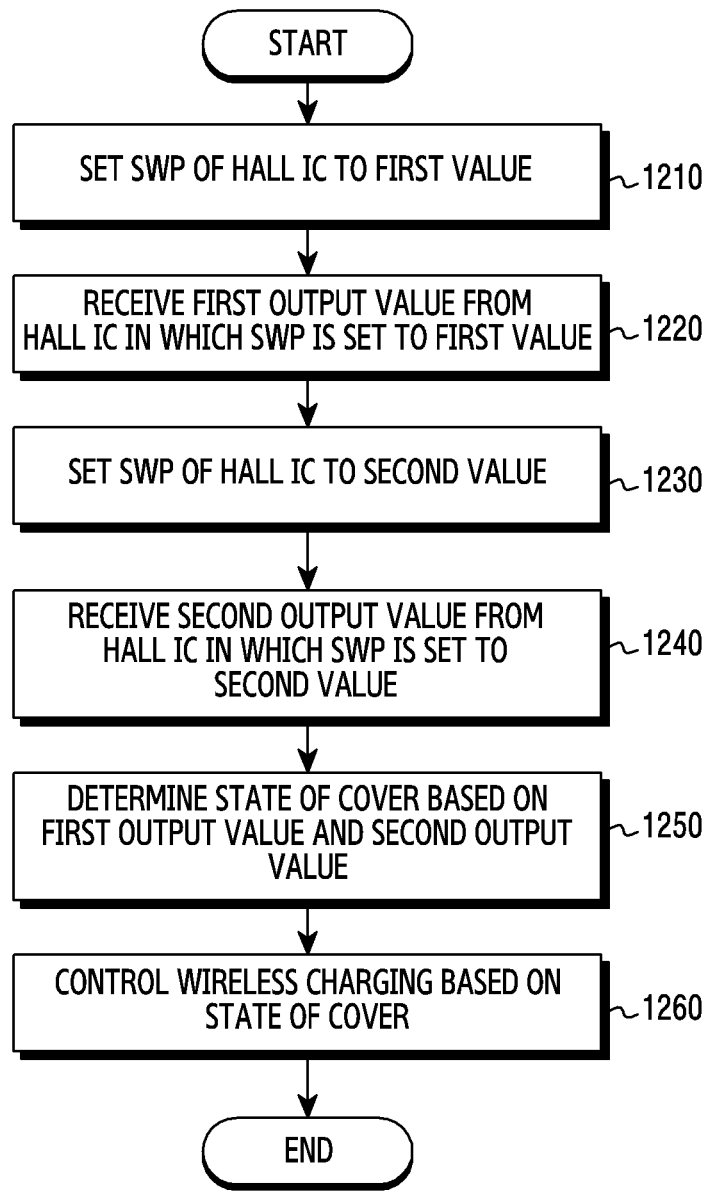
FIG. 12 shows an example of an operation in which an electronic device receives an output value of a hall IC according to some embodiments.

FIG. 12 shows an example of an operation in which an electronic device receives an output value of a hall IC according to some embodiments. The operations shown in FIG. 12 may be performed by an electronic device including the hall IC 900. The hall IC 900 may correspond to the second hall IC 420.

Referring to FIG. 12, in operation 1210, the processor 120 may set the switching pin (i.e., the SWP) of the hall IC 900 to a first value (e.g., "high" or 1). When the switching pin is set to the first value, the hall IC 900 may detect only the magnetic flux in the first direction.

In operation 1220, the processor 120 may receive an output value from the hall IC 900 in which the switching pin has been set to the first value. The output value of the hall IC in which the switching pin has been set to the first value may be referred to as a "first output value". For example, if the magnetic flux in the first direction is equal to or greater than a predetermined value, the processor 120 may receive a second value 932 (e.g., "low" or 0) from the output pin. If the magnetic flux in the first direction is less than a predetermined value, the processor 120 may receive a first value 931 (e.g., "high" or 1) from the output pin.

In operation 1230, the processor 120 may set the switching pin of the hall IC 900 to a second value (e.g., "low" or 0). When the switching pin is set to the second value, the hall IC 900 may detect only the magnetic flux in the second direction.

In operation 1240, the processor 120 may receive an output value from the hall IC in which the switching pin has been set to the second value. The output value of the hall IC in which the switching pin has been set to the second value may be referred to as a "second output value". For example, if the magnetic flux in the second direction is equal to or greater than a predetermined value, the processor 120 may receive a second value 952 (e.g., "low" or 0) from the output pin. If the magnetic flux in the second direction is less than a predetermined value, the processor 120 may receive a first value 951 (e.g., "high" or 1) from the output pin. Operations 1210 to 1240 may be performed periodically.

In operation 1250, the processor 120, based on the first output value and the second output value, may determine the state of the external device 400. For example, if the first output value and the second output value are ("low" and "high") {or (0 and 1)}, the processor 120 may determine that the state of the external device 400 is the closed state 510. If the first output value and the second output value are ("high" and "high") {or (1 and 1)}, the processor 120 may determine that the state of the external device 400 is the open state 530. If the first output value and the second output value are ("high" and "low") {or (1 and 0)}, the processor 120 may determine that the state of the external device 400 is the backward-folded state 550.

In operation 1260, based on the determined state of the external device 400, the processor 120 may control wireless charging. For example, in operation 1260, operation 1030 in FIG. 10 or operation 1110 in FIG. 11 may be performed.

Figure 13:
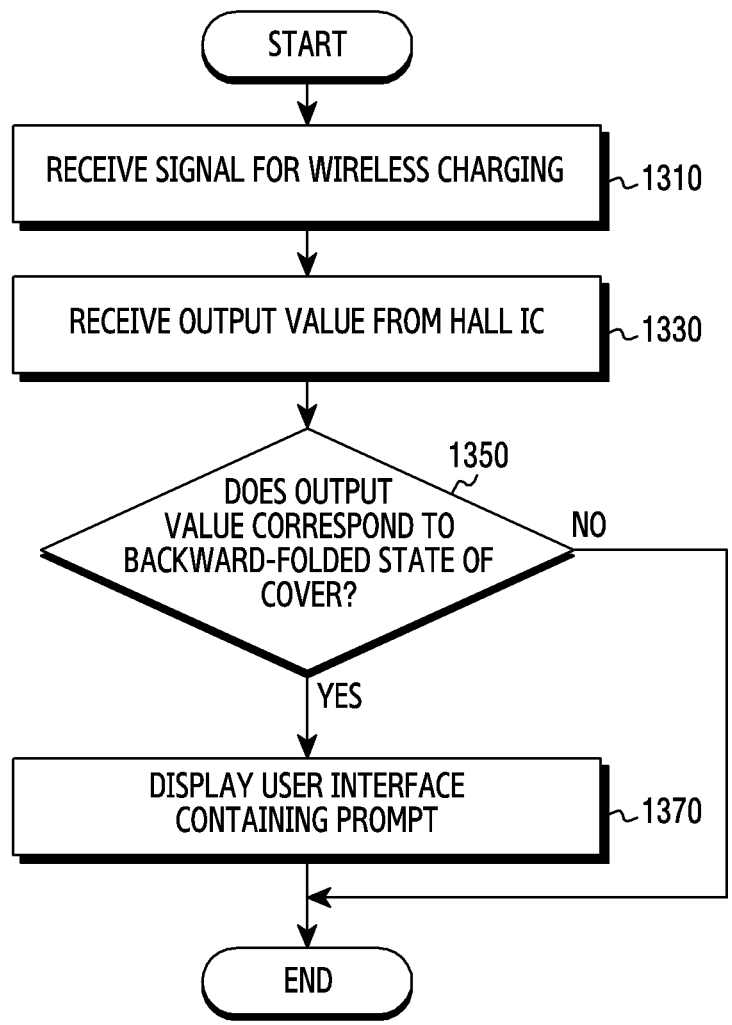
FIG. 13 shows another example of the operation of an electronic device according to various embodiments.

FIG. 13 shows another example of the operation of an electronic device according to various embodiments.

Referring to FIG. 13, in operation 1310, the processor 120 may receive a signal for wireless charging. For example, the signal for wireless charging may be a signal for determining whether or not the object placed on the external wireless charging device is a power receiver (e.g., the electronic device 101). The signal for wireless charging may be a signal for determining whether or not the power receiver (e.g., the electronic device 101) requires power reception. The processor 120 may control the wireless charging module 250 so as to receive a signal for wireless charging through the wireless charging antenna 297-5.

In response to the reception of the signal for wireless charging, the processor 120 may receive output values (e.g., the first output value and the second output value) from the second hall IC 420 (e.g., the hall IC 800 or the hall IC 900) in operation 1330. For example, in response to the reception of the signal for wireless charging, the processor 120 may control the second hall IC 420 so as to detect magnetic flux (e.g., the magnetic flux in the first direction and the magnetic flux in the second direction). As another example, in response to the reception of the signal for wireless charging, the processor 120 may control the second hall IC 420 so as to output a first output value and a second output value. As another example, in response to the reception of the signal for wireless charging, the processor 120 may control the switching pin (i.e., the SWP) of the second hall IC 900 such that a set value of the switching pin switches between the first value and the second value.

In operation 1350, the processor 120 may determine whether or not the received first output value and second output value correspond to the backward-folded state 550 of the external device 400. For example, if the first output value and the second output value are ("high" and "low") {or (1 and 0)}, the processor 120 may determine that the state of the external device 400 is the backward-folded state 550.

When it is determined that the first output value and the second output value correspond to the backward-folded state 550, the processor 120 may display a user interface prompting for removal of the card 450 in operation 1370.

Although it is not shown in the drawing, in operation 1350, operation 1030 in FIG. 10 or operation 1110 in FIG. 11 may be performed. For example, when it is determined that the first output value and the second output value correspond to the backward-folded state 550 in operation 1350, the processor 120 may deactivate the wireless charging circuit, thereby blocking wireless charging. Alternatively, when it is determined that the first output value and the second output value do not correspond to the backward-folded state 550, the processor 120 may maintain the activated state of the wireless charging circuit, thereby performing wireless charging.

Figure 14:
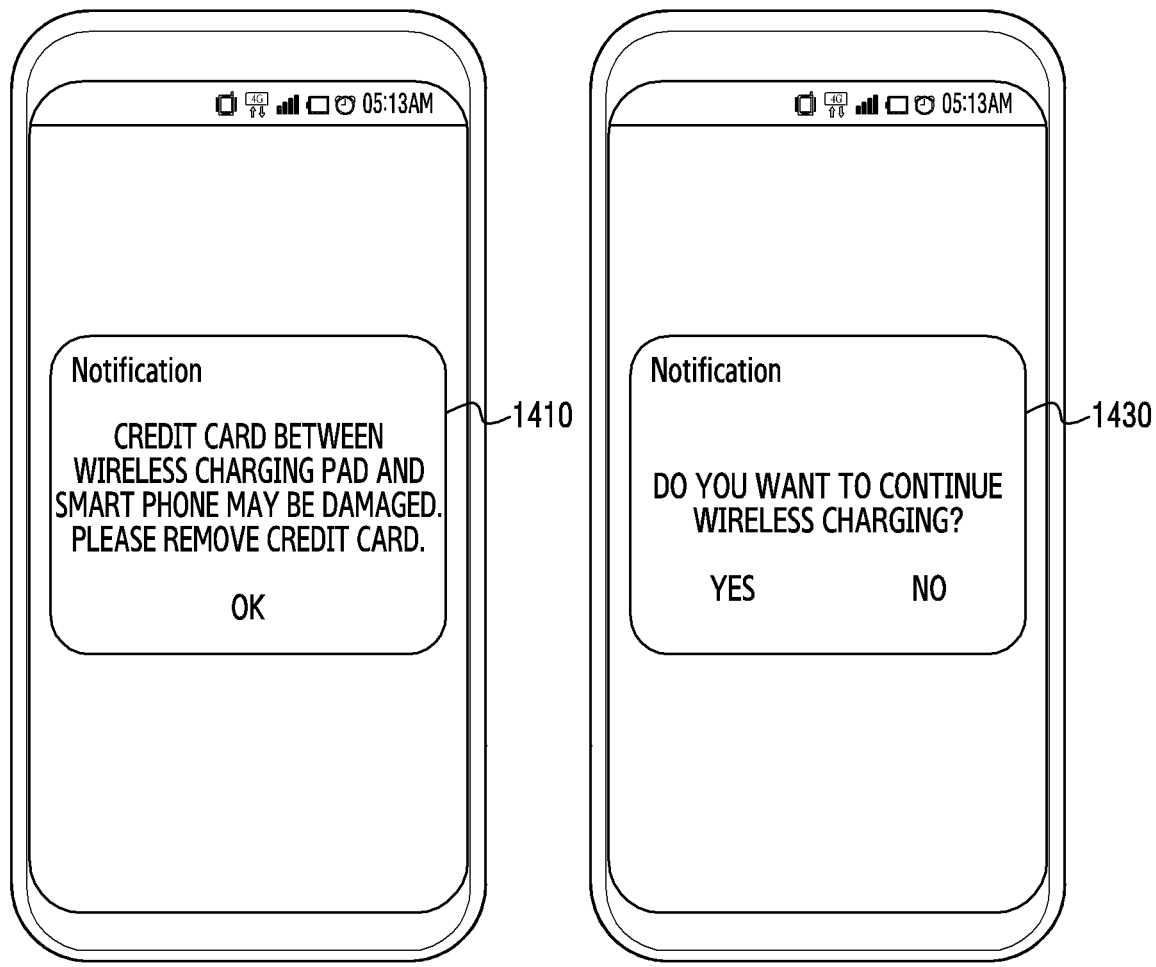
FIG. 14 shows an example in which an electronic device provides a user interface according to various embodiments.

FIG. 14 shows an example in which an electronic device provides a user interface according to various embodiments.

Referring to FIG. 14, the electronic device 101 may display a first UI 1410 or a second UI 1430 prompting for removal of the card 450 through the display 660. The first UI 1410 or the second UI 1430 may be displayed in operation 1370 in FIG. 13.

When a signal for wireless charging is received, and when the state of the external device 400 is determined to be the backward-folded state 500, the electronic device 101 may display the first UI 1410. The first UI 1410 may contain a message providing notification that the card 450 between the external wireless charging device and the electronic device 101 may be damaged. The first UI 1410 may contain a message to guide the removal of the card 450. While the first UI 1410 is displayed, the processor 120 may perform control such that the wireless charging circuit is in the deactivated state. Wireless charging may not be performed while the first UI 1410 is displayed.

When a signal for wireless charging is received, and when the state of the external device 400 is determined to be the backward-folded state 500, the electronic device 101 may display a second UI 1430. The second UI 1430 may be used to receive a user input for determining whether or not to perform wireless charging.

For example, the second UI 1430 may be displayed in response to the reception of a user input (e.g., an input of pressing an OK button) on the first UI 1410. In response to the reception of an input (e.g., an input of pressing a YES button) for performing wireless charging on the second UI 1430, the processor 120 may activate the wireless charging circuit. When the wireless charging circuit is activated, the electronic device 101 may perform wireless charging. In response to the reception of an input (e.g., an input of pressing a NO button) for blocking wireless charging on the second UI 1430, the processor 120 may deactivate the wireless charging circuit. When the wireless charging circuit is deactivated, the electronic device 101 may not perform wireless charging. As another example, the second UI may be displayed when a signal for wireless charging is received, and when the state of the external device 400 is determined to be the backward-folded state 500, regardless of the first UI 1410.

Figure 15:
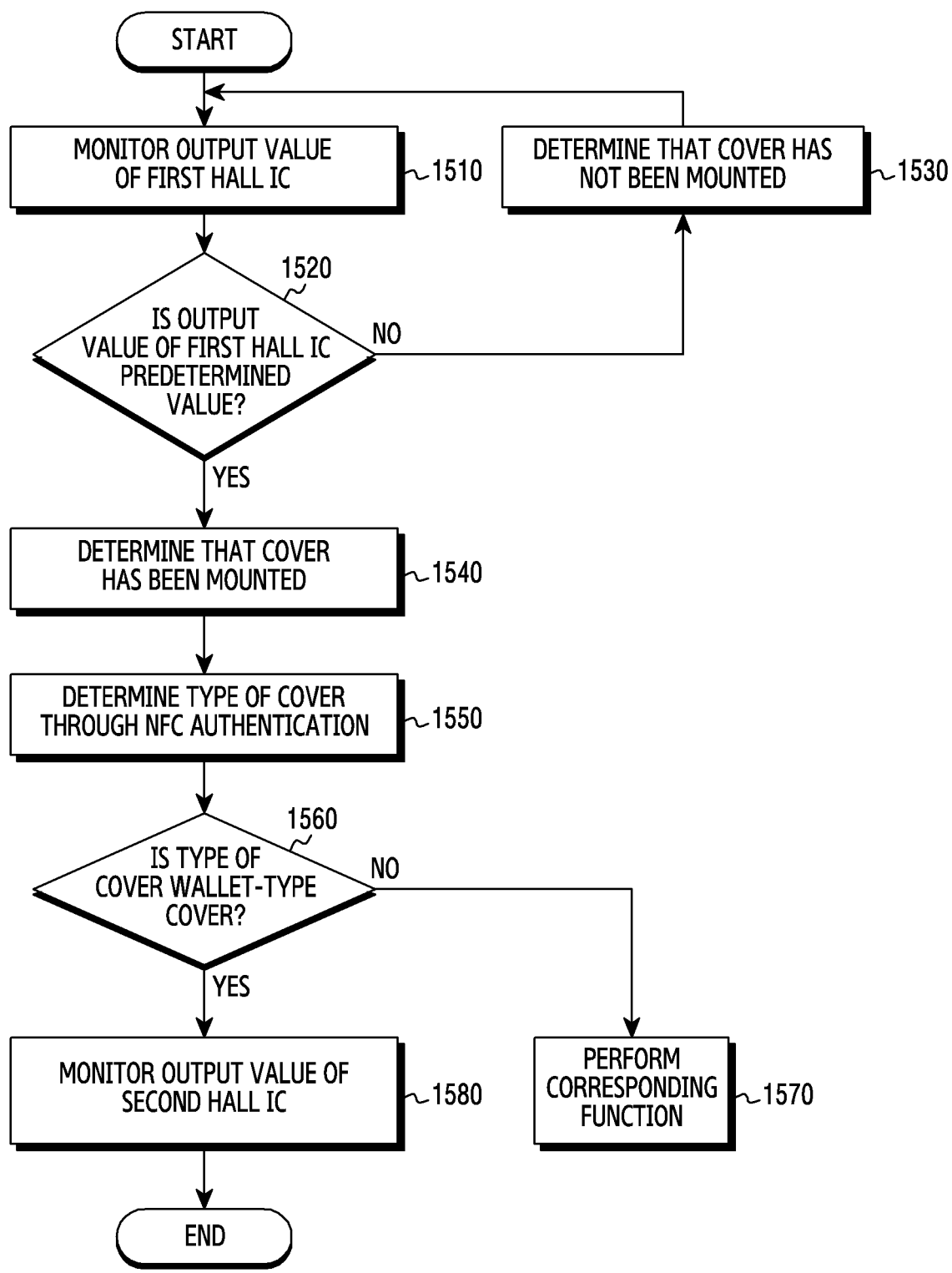
FIG. 15 shows an example of an operation of monitoring an output value of a second hall IC when a predetermined type of external device is mounted on an electronic device according to various embodiments.

FIG. 15 shows an example of an operation of monitoring an output value of a second hall IC when a predetermined type of external device is mounted on an electronic device according to various embodiments.

Referring to FIG. 15, in operation 1510, the processor 120 may monitor an output value of the first hall IC 410. The processor 120 may receive an output value of the first hall IC 410. The output value of the first hall IC 410 may be determined depending on the intensity of the magnetic field (or magnetic flux) generated by the first magnet 430 included in the external device 400. For example, if the magnitude of the magnetic field passing through the first hall IC 410 is equal to or greater than a predetermined value, the processor 120 may receive a second value (e.g., "low" or 0) from the output pin of the first hall IC 410. If the magnitude of the magnetic field passing through the first hall IC 410 is less than a predetermined value, the processor 120 may receive a first value (e.g., "high" or 1) from the output pin of the first hall IC 410. The output value of the first hall IC 410 may be used to determine whether or not the external device 400 has been mounted on the electronic device 101.

In operation 1520, the processor 120 may determine whether or not the output value of the first hall IC 410 is a predetermined value. For example, if the output value of the first hall IC 410 is a second value (e.g., "low" or 0), the processor 120 may determine that the external device 400 has been mounted on operation 1540.

If the output value of the first hall IC 410 is not the second value (e.g., "low" or 0), the processor 120 may determine that the external device 400 has not been mounted in operation 1530. For example, if the output value of the first hall IC 410 is a first value (e.g., "high" or 1), the processor 120 may determine that the external device 400 has not been mounted.

In response to the a determination that the external device 400 has been mounted, the processor 120 may determine the type of external device 400 through NFC authentication in operation 1550. For example, the processor 120 may control the NFC communication module 230 so as to receive a signal via the NFC antenna 297-3 in order to perform authentication of the external device 400. The processor 120 may receive a signal including information on the type of external device 400 from the wireless communication circuit 690 (e.g., an NFC authentication chip) included in the external device 400.

In operation 1560, based on the signal received via the NFC antenna 297-3, the processor 120 may determine whether or not the type of the cover (e.g., the external device 400) mounted on the electronic device is a cover including a lid 402 (e.g., a diary-type case, a flip cover, a wallet-type case, or the like).

If the type of the cover mounted on the electronic device 101 does not correspond to a cover including a lid 402, the processor 120 may perform a corresponding function in operation 1570. For example, the processor 120 may execute an application related to the cover mounted on the electronic device 101, or may terminate operations.

Based on the determination that the type of the cover (e.g., the external device 400) mounted on the electronic device 101 is a cover including a lid 402 (e.g., a diary-type case, a flip cover, a wallet-type case, or the like), the processor 120 may monitor an output value (e.g., the first output value and the second output value) of the second hall IC 420 in operation 1580. For example, in operation 1580, operation 710 in FIG. 7, operation 910 in FIG. 9, operation 1210 in FIG. 12, or operation 1330 in FIG. 13 may be performed.

An operating method of an electronic device (e.g., the electronic device 101) according to various embodiments described above may include: letting a hall integrated circuit (IC) (e.g., the second hall IC 420) of the electronic device detect magnetic flux generated by an external device (e.g., the external device 400) enclosing at least a portion of the electronic device; letting at least one processor (e.g., the processor 120) of the electronic device receive an output value for the detected magnetic flux from the hall IC; and letting the at least one processor control a wireless charging circuit (e.g., the wireless charging module 250 of the power management module 188 or the charging circuit 310 of the power management module 188) of the electronic device, based on the output value.

In various embodiments, the controlling of the wireless charging circuit, based on the output value, may include deactivating the wireless charging circuit if the output value corresponds to the state in which a lid (e.g., the lid 402) of the external device is folded backwards (e.g., the backward-folded state).

In various embodiments, the output value may include a first output value for magnetic flux in a first direction and a second output value for magnetic flux in a second direction opposite the first direction, among the magnetic flux generated by the external device. In some embodiments, the hall IC may include a first output pin configured to output the first output value and a second output pin configured to output the second output value. In some other embodiments, the hall IC may include a switching pin and an output pin, and the method may further include: letting the output pin output the first output value for the magnetic flux in the first direction when the switching pin is set to a first value; and letting the output pin output the second output value for the magnetic flux in the second direction when the switching pin is set to a second value. For example, the method may further include letting the at least one processor periodically switch the switching pin between the first value and the second value.

In various embodiments, the controlling of the at least one processor for the wireless charging circuit of the electronic device, based on the output value, may include letting the at least one processor determine whether the lid of the external device is in one of a closed state (e.g., the closed state 510), an open state (e.g., the open state 530), or a backward-folded state (e.g., the backward-folded state 550), based on the output value.

In various embodiments, the method may further include: letting the at least one processor determine whether or not the lid of the external device is in the backward-folded state, based on the output value, in response to reception of a signal for wireless charging; and letting the at least one processor deactivate the wireless charging circuit in response to a determination that the lid of the external device is in the backward-folded state.

In various embodiments, the method may further include letting the at least one processor display a user interface prompting for removal of a card accommodated in the lid when a signal for wireless charging is received and when the output value corresponds to the state in which the lid of the external device is folded backwards.

In various embodiments, the magnetic flux detected by the hall IC may be in the first direction when the lid of the external device is closed, and may be in the second direction opposite the first direction when the lid of the external device is folded backwards.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An electronic device comprising:
a hall integrated circuit (IC) configured to detect magnetic flux generated by an external device enclosing at least a portion of the electronic device;
a wireless charging circuit; and
at least one processor configured to be connected to the hall IC and the wireless charging circuit,
wherein the at least one processor is configured to:
receive an output value for the detected magnetic flux from the hall IC; and
control the wireless charging circuit, based on the output value,
wherein the magnetic flux detected by the hall IC is in a first direction when a lid of the external device is closed and is in a second direction opposite the first direction when the lid of the external device is folded backwards.

2. The electronic device of claim 1, wherein the at least one processor is configured to deactivate the wireless charging circuit if the output value corresponds to a state in which the lid of the external device is folded backwards.

3. The electronic device of claim 2, wherein the output value comprises a first output value for magnetic flux in the first direction and a second output value for magnetic flux in the second direction, opposite the first direction, among the magnetic flux generated by the external device.

4. The electronic device of claim 3, wherein the hall IC comprises a first output pin configured to output the first output value and a second output pin configured to output the second output value.

5. The electronic device of claim 3, wherein the hall IC comprises a switching pin and an output pin,
wherein the output pin is configured to output the first output value for the magnetic flux in the first direction when the switching pin is set to a first value, and
wherein the output pin is configured to output the second output value for the magnetic flux in the second direction when the switching pin is set to a second value.

6. The electronic device of claim 5, wherein the at least one processor is configured to periodically switch the switching pin between the first value and the second value.

7. The electronic device of claim 1, wherein the at least one processor is configured to determine whether the lid of the external device is in one of a closed state, an open state, or a backward-folded state, based on the output value.

8. The electronic device of claim 1, wherein the at least one processor is configured to:
in response to reception of a signal for wireless charging, determine whether or not the lid of the external device is in a backward-folded state, based on the output value; and
in response to a determination that the lid of the external device is in the backward-folded state, deactivate the wireless charging circuit.

9. The electronic device of claim 1, wherein the at least one processor is configured to display a user interface prompting for removal of a card accommodated in the lid when a signal for wireless charging is received, and when the output value corresponds to a state in which the lid of the external device is folded backwards.

10. An operating method of an electronic device, the method comprising:
detecting, by a hall integrated circuit (IC) of the electronic device, magnetic flux generated by an external device enclosing at least a portion of the electronic device;
receiving, by at least one processor of the electronic device, an output value for the detected magnetic flux from the hall IC; and
controlling, by the at least one processor, a wireless charging circuit of the electronic device, based on the output value,
wherein the magnetic flux detected by the hall IC is in a first direction when a lid of the external device is closed and is in a second direction opposite the first direction when the lid of the external device is folded backwards.

11. The method of claim 10, wherein the controlling of the wireless charging circuit, based on the output value, comprises deactivating the wireless charging circuit if the output value corresponds to a state in which the lid of the external device is folded backwards.

12. The method of claim 11, wherein the output value comprises a first output value for magnetic flux in the first direction and a second output value for magnetic flux in the second direction opposite the first direction, among the magnetic flux generated by the external device.

13. The method of claim 12, wherein the hall IC comprises a switching pin and an output pin,
and the method further comprises:
outputting, by the output pin, the first output value for the magnetic flux in the first direction when the switching pin is set to a first value; and
outputting, by the output pin, the second output value for the magnetic flux in the second direction when the switching pin is set to a second value.

14. The method of claim 13, further comprising periodically switching, by the at least one processor, the switching pin between the first value and the second value.

15. The method of claim 12, wherein the hall IC comprises a first output pin configured to output the first output value and a second output pin configured to output the second output value.

16. The method of claim 10, wherein the controlling, by the at least one processor, of the wireless charging circuit of the electronic device, based on the output value, comprises determining, by the at least one processor, whether the lid of the external device is in one of a closed state, an open state, or a backward-folded state, based on the output value.

17. An electronic device comprising:
a sensor configured to obtain a first signal corresponding to an external device enclosing at least a portion of the electronic device;
a wireless charging circuit; and
at least one processor,
wherein the at least one processor is configured to:
obtain the first signal from the sensor; and
if the first signal satisfies a predetermined condition, prevent the electronic device from being charged using the wireless charging circuit,
wherein the first signal detected by the sensor is in a first direction when a lid of the external device is closed and is in a second direction opposite the first direction when the lid of the external device is folded backwards.

18. The electronic device of claim 17, wherein the first signal comprises a magnetic field generated from at least a portion of the external device.

19. The electronic device of claim 17, wherein the sensor comprises a hall integrated circuit (IC).

* * * * *